(12) United States Patent
Vorhaus

(10) Patent No.: US 8,519,916 B2
(45) Date of Patent: Aug. 27, 2013

(54) LOW INTERCONNECT RESISTANCE INTEGRATED SWITCHES

(75) Inventor: James L. Vorhaus, Chapel Hill, NC (US)

(73) Assignee: Sarda Technologies, Inc., Durham, NC (US)

( * ) Notice: Subject to any disclaimer, the term of this patent is extended or adjusted under 35 U.S.C. 154(b) by 74 days.

(21) Appl. No.: 13/205,433

(22) Filed: Aug. 8, 2011

(65) Prior Publication Data

US 2012/0037917 A1 Feb. 16, 2012

Related U.S. Application Data

(60) Provisional application No. 61/372,513, filed on Aug. 11, 2010.

(51) Int. Cl.
*G09G 3/30* (2006.01)
*G05F 3/16* (2006.01)

(52) U.S. Cl.
USPC ............ 345/76; 345/55; 323/282; 323/283; 257/76; 257/279; 257/289; 257/347; 257/E21.431; 257/E27.111; 257/E29.127; 257/E29.151; 438/301; 438/487

(58) Field of Classification Search
USPC .............. 345/55, 76; 323/282, 283; 257/76, 257/279, 289, 347, E21.431, E27.111, E29.127, 257/E29.151; 438/301, 487
See application file for complete search history.

(56) References Cited

U.S. PATENT DOCUMENTS

| | | | | |
|---|---|---|---|---|
| 2002/0142554 A1* | 10/2002 | Nakajima | ............ | 438/301 |
| 2007/0200803 A1* | 8/2007 | Kimura | ............ | 345/76 |
| 2007/0236424 A1* | 10/2007 | Kimura | ............ | 345/76 |
| 2010/0171685 A1* | 7/2010 | Kimura | ............ | 345/76 |
| 2012/0032606 A1* | 2/2012 | Fukumoto et al. | ............ | 315/240 |

* cited by examiner

*Primary Examiner* — Dao H Nguyen
(74) *Attorney, Agent, or Firm* — Carr & Ferrell LLP

(57) ABSTRACT

Circuits and systems comprising one or more switches are provided. A circuit includes a first switch formed on a substrate; and a second switch formed on the substrate, the second switch including a first terminal coupled to a third terminal of the first switch. A system includes a supply; a first switch formed on a substrate, the first switch coupled to the supply; a second switch formed on the substrate, the second switch coupled to the first switch; a third switch formed on the substrate, the third switch coupled to the supply; a fourth switch formed on the substrate, the fourth switch coupled to the third switch; and a driver coupled to respective second terminals of the first, second, third, and fourth switches.

20 Claims, 58 Drawing Sheets

*gFET*™ device in Converter

1 – V$_{in}$
2 – V$_{out}$
3 – Ground
4 – Control FET Input
5 – Sync FET Input

Figure 8  Singulation and Die Bonding

Bonded Die Thinning
(optional)

Figure 21 — Cutaway View of First Metal Layer

C – – C'

Comparison

|  | fujitsu 50W LDMOS FET | MPBP Power FET[3] |
|---|---|---|
| Die Size (mm²)[1] | 3.96 (3.7 x 1.2) | 2.496 (1.56 x 1.6) |
| Gate Periphery (mm) | 86.4 | 86.2 |
| Device Yield (%)[2] | 92.177 | 99.989 |
| Gross Die per 6" Wafer | 4262 | 6867 |
| Yielded Die | 3928 | 6866 |

Projected 75% more good die per wafer with the MPBP device

[1] Includes dicing street
[2] Calculated based on measured yield of 94.5% for a 60mm FET device
[3] Calculated based on target gate periphery Figure 29 — Post Connections Between First and Last Level Metal

Figure 31

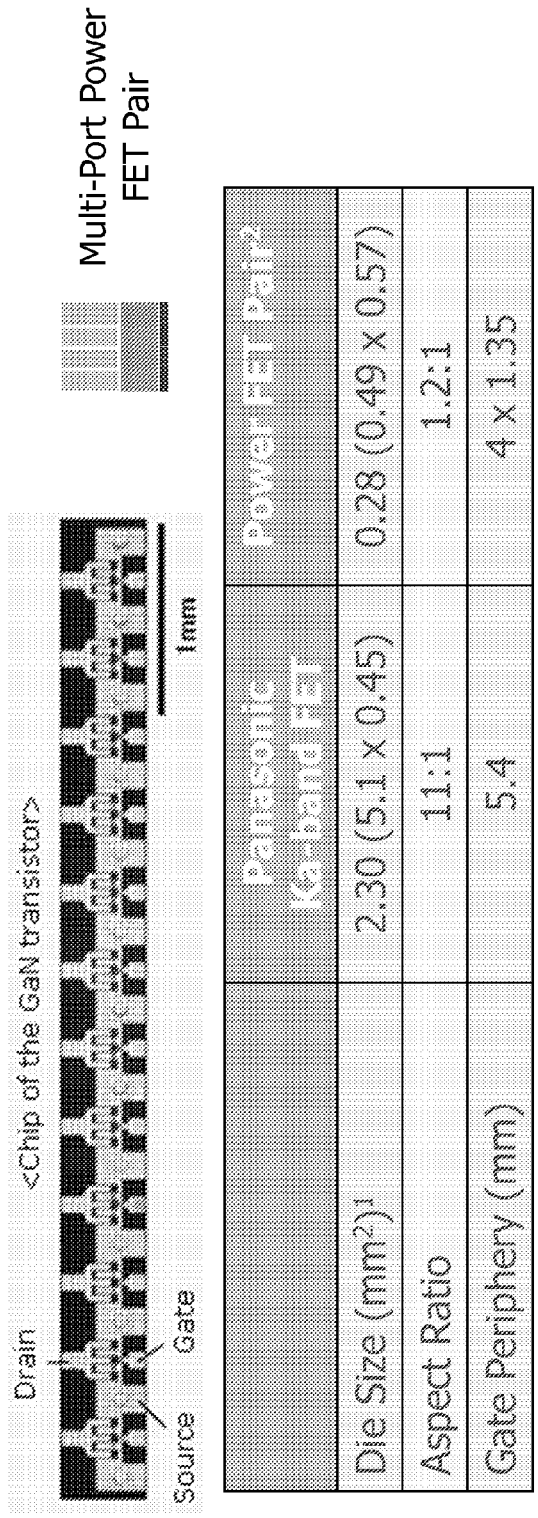

Comparison

| | Parasitic (X-band FET) | Power FET Pair |
|---|---|---|
| Die Size (mm²)[1] | 2.30 (5.1 × 0.45) | 0.28 (0.49 × 0.57) |
| Aspect Ratio | 11:1 | 1.2:1 |
| Gate Periphery (mm) | 5.4 | 4 × 1.35 |

- Higher output impedance for easier matching
- More die per wafer (>8x) with the Power FET device
- Much easier die handling because of better aspect ratio
- Elimination of 24 wire bonds and accompanying yield impact and performance degradation due to bond length variation

[1]Includes dicing street
[2]Calculated based on target gate periphery gFET™ device in Converter
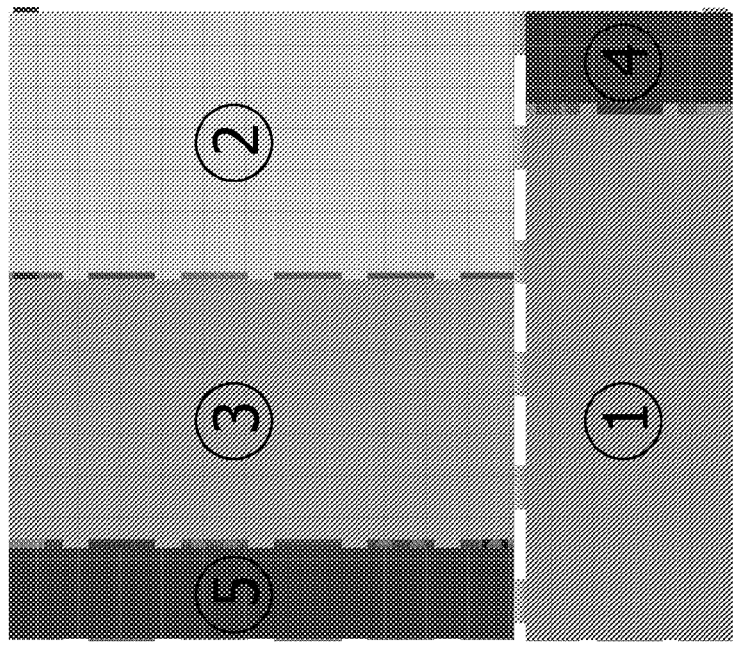
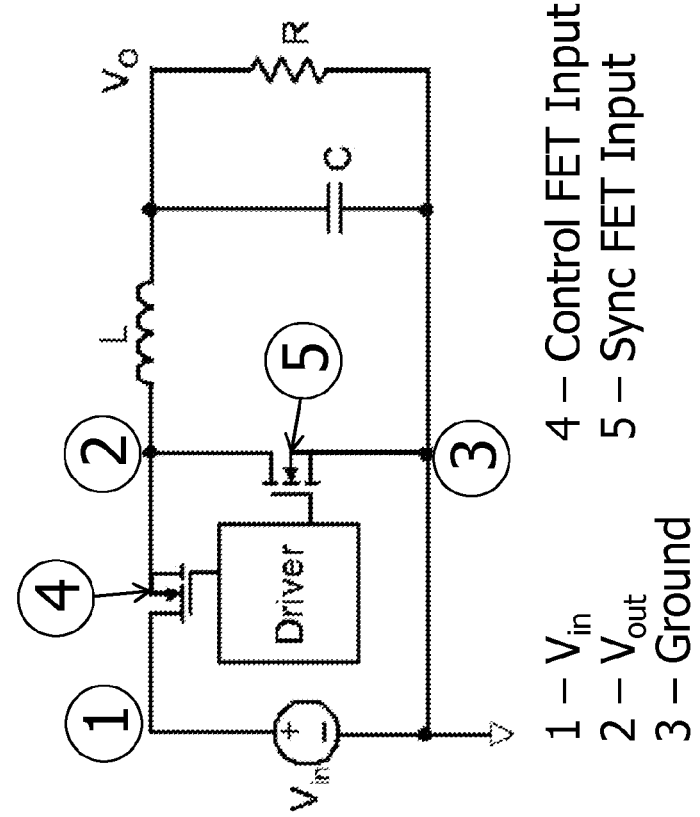
1 – $V_{in}$
2 – $V_{out}$
3 – Ground
4 – Control FET Input
5 – Sync FET Input
Figure 41

Figure 46 gFET™ device Comparison

| | Unit Cell (all units in microns) | | | Ratio | Die Area (mm²) for $R_{on} = 1\ m\Omega$* | Gross Die/Wafer | |
|---|---|---|---|---|---|---|---|
| | $W_g$ | Width | Length | µm/µm² | | 4" | 6" |
| Standard Power FET | 200 | 70 | 100 | 0.029 | 35 | 224 | 505 |
| gFET™ device | 600 | 72 | 100 | 0.083 | 12 | 654 | 1473 |
| gFET™ device (alt 1) | 800 | 72 | 100 | 0.111 | 9 | 873 | 1963 |
| gFET™ device (alt 2) | 600 | 42 | 100 | 0.143 | 7 | 1122 | 2524 |

*Assumes $R_{on} = 1\ \Omega\text{-mm}$

| | Conventional CS Switch FET[3] | gFET™ device[3] |
|---|---|---|
| Die Size (mm²)[1] | 39.4 | 9.4 |
| Gate Periphery (mm) | 1000 | 1000 |
| Device Yield (%)[2] | 38.89 | 99.72 |
| Gross Die per 6" Wafer | 381 | 1760 |
| Yielded Die | 148 | 1755 |

Projected 12x more good die per wafer with the MPBP process

[1]Includes dicing street
[2]Calculated based on measured yield of 94.5% for a 60mm FET device
[3]Calculated based on target gate periphery

Figure 48

Comparison

| Device Parameters | GWS24N07 | gFET™ device |
|---|---|---|
| BV$_{dss}$ (V) | 11 | >20 (>50 if GaN) |
| V$_{th}$ (V) | 1.0 | -2.0 |
| R$_{on}$ (mΩ) | 1.25 (@ 4.5V) | 1.0 (@ 0V, less @ 0.5V) |
| Q$_g$ (nC) | 22 (@ 4.5V) | 10[1] (@ 0V)<br>5[2] (@ 0V) |
| FOM (mΩ*nC) | 27.5 | 10[1]<br>5[2] |
| R$_g$ (Ω) | 0.4 | 0.25[1]<br>0.5[2] |
| Package Footprint (mm²) | 9.5 | 9.4[3] |

[1] L$_g$ = 1 μm
[2] L$_g$ = 0.5 μm
[3] Includes Control FET

Cutaway View of Cu Vias Between First and Last Metal Layers

B ----- B'

Figure 57 — Cutaway View of Cu Vias Between First and Last Metal Layers

C -----  C'

LOW INTERCONNECT RESISTANCE INTEGRATED SWITCHES

CROSS-REFERENCE TO RELATED APPLICATIONS

The present application claims priority benefit from U.S. provisional patent application No. 61/372,513 filed Aug. 11, 2010 and entitled "Field Effect Transistor and Method of Making Same," the disclosure of which is incorporated by reference herein in its entirety.

FIELD OF THE INVENTION

The present invention relates to compound semiconductor devices and, more particularly to field effect transistors.

BACKGROUND

"Performance per watt" is a key differentiator for smart phones, tablets, notebook PCs and other portable electronic systems. These systems require more computing performance and functionality, lower power consumption for longer battery life and smaller, thinner form factors. Such systems use multiple DC-DC voltage converters to reduce the 3-20 Volts supplied by one or more batteries to the 0.5-1 Volts required by processors, memories, displays, and other components.

Today's inefficient voltage converters waste power when they generate heat which often must be managed, shortens battery life, and limits system performance. The switches used in voltage converters may be a key determinant of the converters' efficiency and performance. Given the preponderance of portable electronic systems throughout the world, reducing the amount of energy wasted in voltage converters may significantly contribute to global energy conservation.

SUMMARY OF THE INVENTION

The present invention relates to field effect transistors (FETs) and methods of making them include using three-dimensional interconnect technology, namely, the Sarda design and compound semiconductor substrate material. FETs accordingly to embodiments of the present invention comprise compound semiconductor materials, for example Gallium Arsenide (GaAs) and Gallium Nitride (GaN). In embodiments of the present invention, methods of manufacturing FET devices include metal posts created on each source and drain finger in a pattern, and are embedded in an oxide layer covering the entire surface of the device; a corresponding wafer with interconnect patterns and metal posts may be chemically treated and aligned with the oxide layer, creating strong oxide-oxide bonds. A patterned metal layer may be separated by a dielectric material created using a copper damascene process. Structures according to the present invention may provide narrowed source and drain fingers, and alternating with others that are wide enough to support the Sarda design.

These and other aspects of the present invention will become apparent to those skilled in the art after a reading of the following description of the preferred embodiment when considered with the drawings, as they support the claimed invention.

BRIEF DESCRIPTION OF THE DRAWINGS

FIG. 31 illustrates a comparison between the power device on the circuit board of FIG. 28 and the multi-port power FET according to embodiments of the present invention.

FIG. 41 is a schematic diagram with the gFET™ device illustrated in FIG. 32 in a converter according to embodiments of the present invention.

FIG. 46 is a table providing a comparison of compound-semiconductor switch devices fabricated with a typical layout and three layouts according to embodiments of the present invention.

FIG. 48 is a tabular comparison between a MOSFET and a gFET™ device according to embodiments of the present invention.

DETAILED DESCRIPTION

Figure 1:
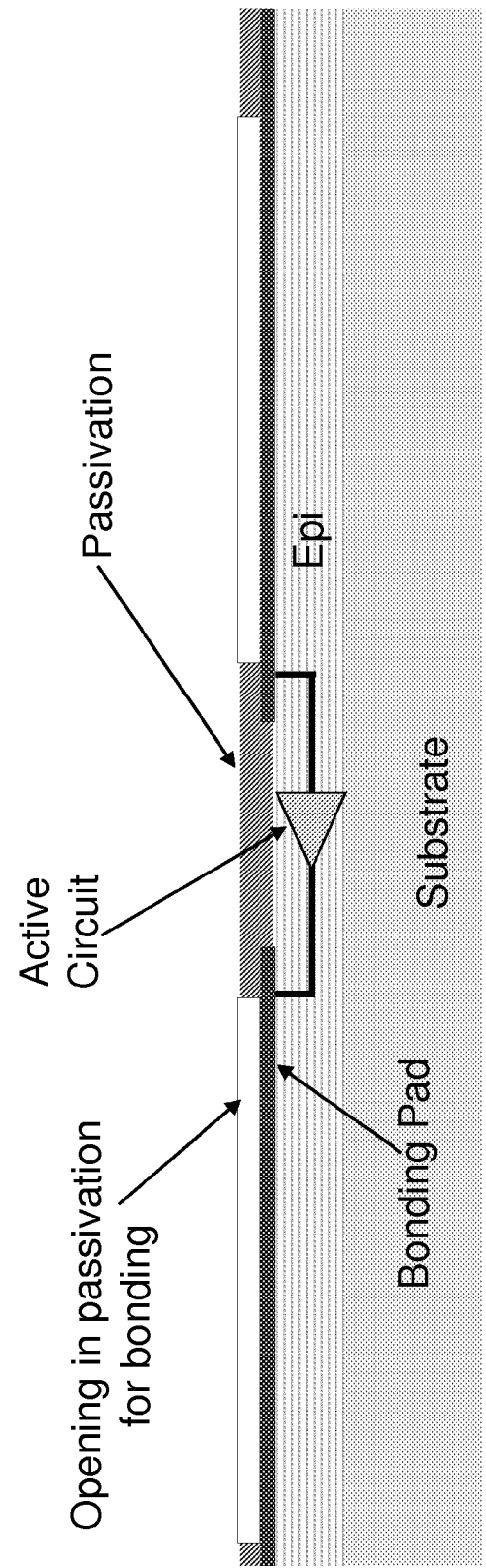
FIG. 1 illustrates a starting material according to a typical process.

FETs, particularly those fabricated from wide band gap compound semiconductors (CS) are usefully applied in switch applications, as they include a combination of high blocking, or off-state, resistance with a low on-state resistance, and fast switching speed. These devices typically have an on-state resistivity of approximately 1 Ohm-mm. In order to achieve on-state resistances in the milli-Ohm range, very large FETs with gate peripheries in the range of many millimeters are required. Typical power FET device layouts usually have large footprints, which require a lot of expensive wafer surface for each die. In contrast, a gFET™ switch device according to embodiments of the present invention is more surface area efficient. Since the cost of a FET device chip is inversely related to its area, because the cost of processing a given wafer is fixed, minimizing the size of the device chip means more die will be obtained from a given wafer and thus each die will be less expensive to manufacture. Therefore embodiments of the present invention, for example the gFET™ device, may be significantly less expensive to manufacture than a comparable switch device using a typical CS power device structure, thereby addressing the problems with typical CS FETs and methods of manufacturing them.

In a layout for a typical FET, having a drain metal, source metal, and gate metal, the source and drain fingers may be about 30 microns each in width and the channel in which the gate may be positioned may be 5 microns in length, which are typical for a CS power FET device. As used herein, the corresponding short dimension of the gate structure is referred to as its length and accordingly the other dimension is its width. It may be possible with a basic layout for a typical FET to have some reduced source and drain finger widths, which may be helpful for compacting the device to a some degree. For example, considering representative dimensions for typical FETs, if the source and drain finger widths were 7 microns each then the same symmetrical unit cell (now illustrated as 72×100 microns in dimension) encompasses three (3) times the gate width at 600 microns (an increase in the gate width to area ratio by 2.9 times). However, the channel length would not be shrunk proportionately because of the various device performance restrictions, such as breakdown voltage. Also, the ability to shrink the source and drain finger widths in particular may be limited in typical power FET layouts, because of lithography constraints associated with the typical interconnect technology as well as thermal and current density considerations. If the source fingers are interconnected using air bridge technology, there may be a minimum width to ensure compatibility with the lithography demands of that process step. While there are other methods for creating an air bridge, for example, over a gate busbar, that may change requirements, there continue to be constraints associated with typical devices that include the essentially two dimensional die layout. Tradeoffs include efficient use of the area, complexity of the process, and thermal issues and electrical considerations, such as DC resistive losses, RF losses, and RF phase variations.

For interconnecting multiple source, gate and drain fingers to one or several points, there may be some crossing via air bridge, such as source crossing each gate-drain gate combination, to get to the next source or a pad for connection. Since the connections may be made in three dimensions from a two dimensional surface, these connections may be made up, over, or under the device. Given all these constraints, typical power FET devices typically require source and drain fingers that are at least about 20-30 microns in width.

To address and resolve issues, the Sarda design provides for size-minimized field effect transistors (FETs) and devices made therefrom, and methods of making them using three-dimensional interconnect technology. The FET structure further includes a patterned metal layer, constructed and configured for providing a conductive path to form interconnects between the source and the drain, the metal layer being separated by a dielectric material created, for example, using a copper damascene process. Structures according to the present invention may provide narrowed source and drain fingers, alternating with others that are wide enough to support the Sarda design. FETs accordingly to embodiments of the present invention comprise compound semiconductor materials, for example Gallium Arsenide (GaAs) and Gallium Nitride (GaN). Advantageously, the size of the power FET according to construction, configuration and methods of making according to the present invention provides for substantially reduced, or eliminated, out-board bonding pad areas and other regions that would normally be needed with typical devices that use other interconnect techniques.

Other elements, in addition to the compaction solution provided by embodiments of the present invention, may include: 1) novel device layouts only possible with the FET design of the present invention; and 2) the fact that device layouts and designs of the present invention provide that the gate fingers are fed from both ends, thereby improving yield.

Referring now to the drawings generally, illustrations are for the purpose of describing various embodiments of the invention and are not intended to limit the invention thereto. The figures are provided to demonstrate several illustrations of embodiments constructed and configured according to embodiments of the present invention.

FIG. 1 illustrates a starting material according to a typical process.

Figure 2:
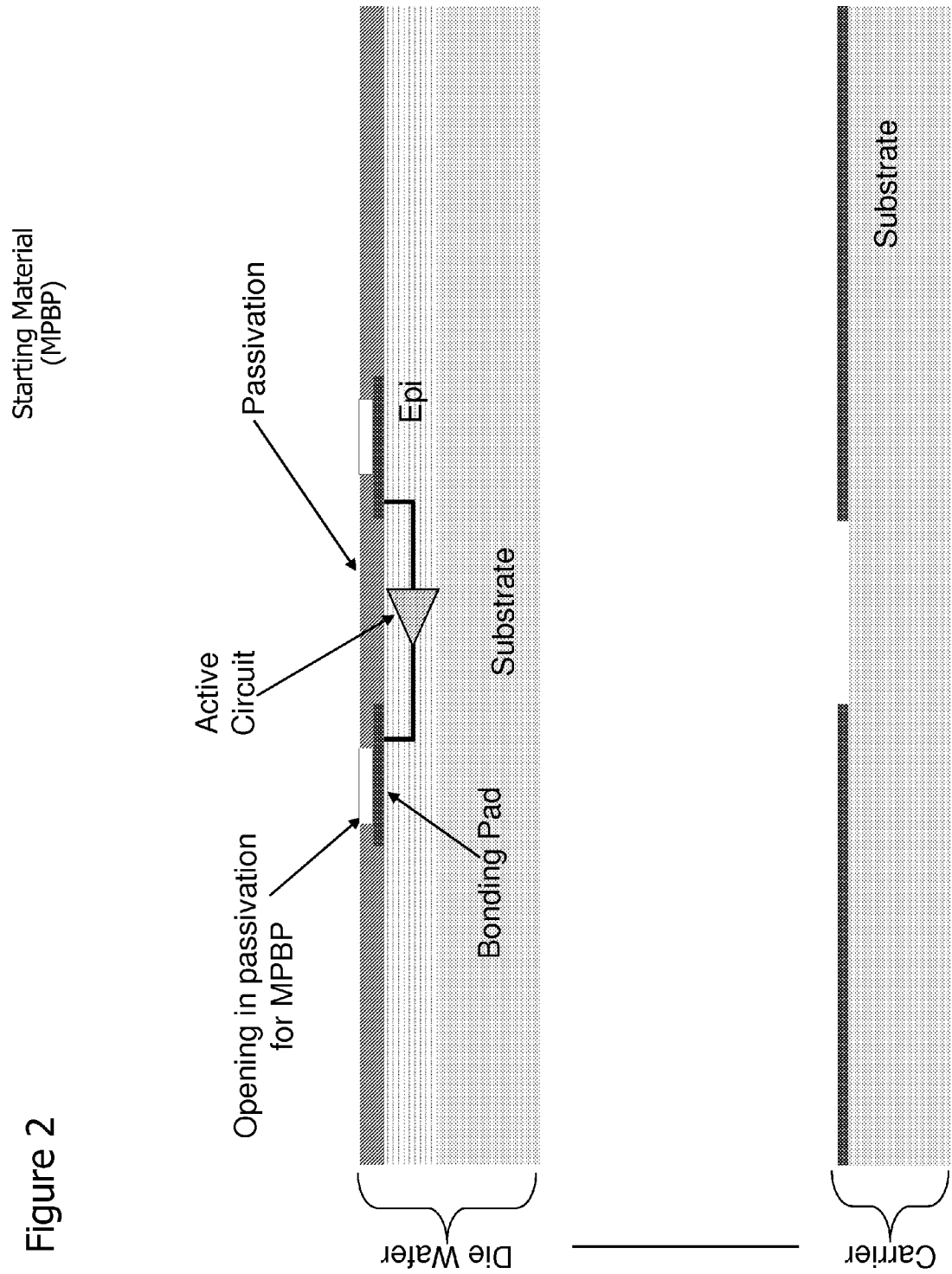
FIG. 2 illustrates starting materials for fabricating field effect transistors (FETs) according to embodiments of the present invention.

FIG. 2 shows a step according to embodiments of the present invention.

Figure 3:
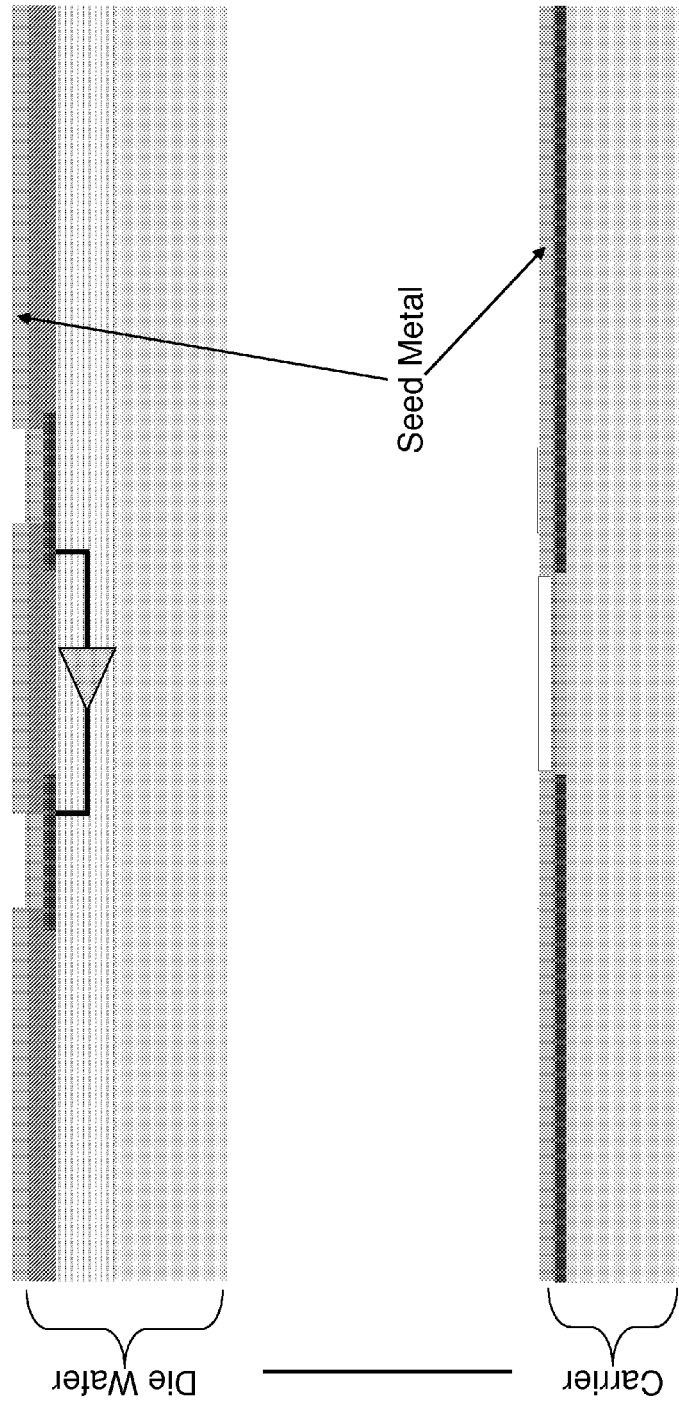
FIG. 3 depicts a seed metal deposition step according to embodiments of the present invention.

FIG. 3 shows a seed metal deposition step according to embodiments of the present invention.

Figure 4:
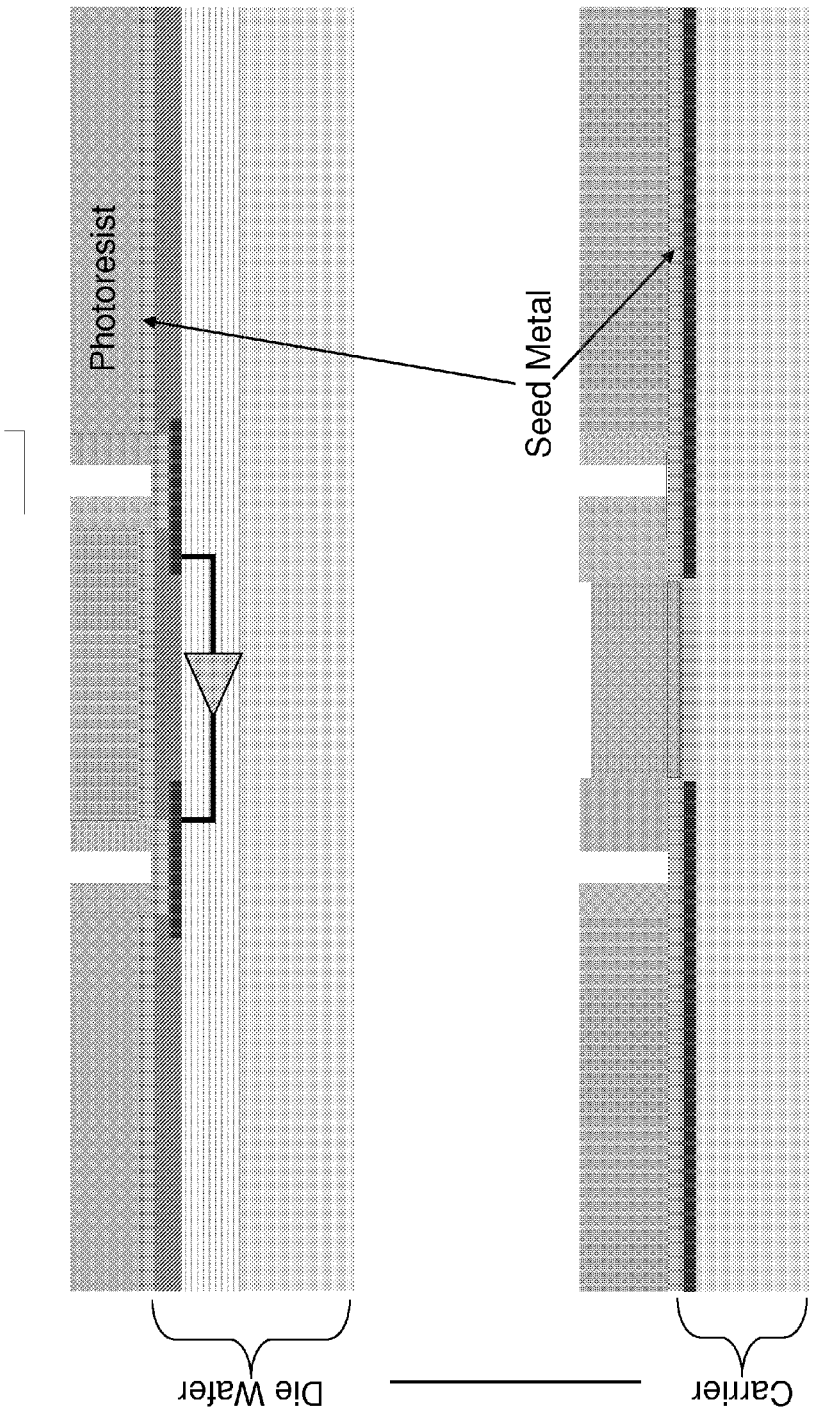
FIG. 4 illustrates a photoresist patterning step according to embodiments of the present invention.

FIG. 4 shows a photoresist patterning step according to embodiments of the present invention.

Figure 5:
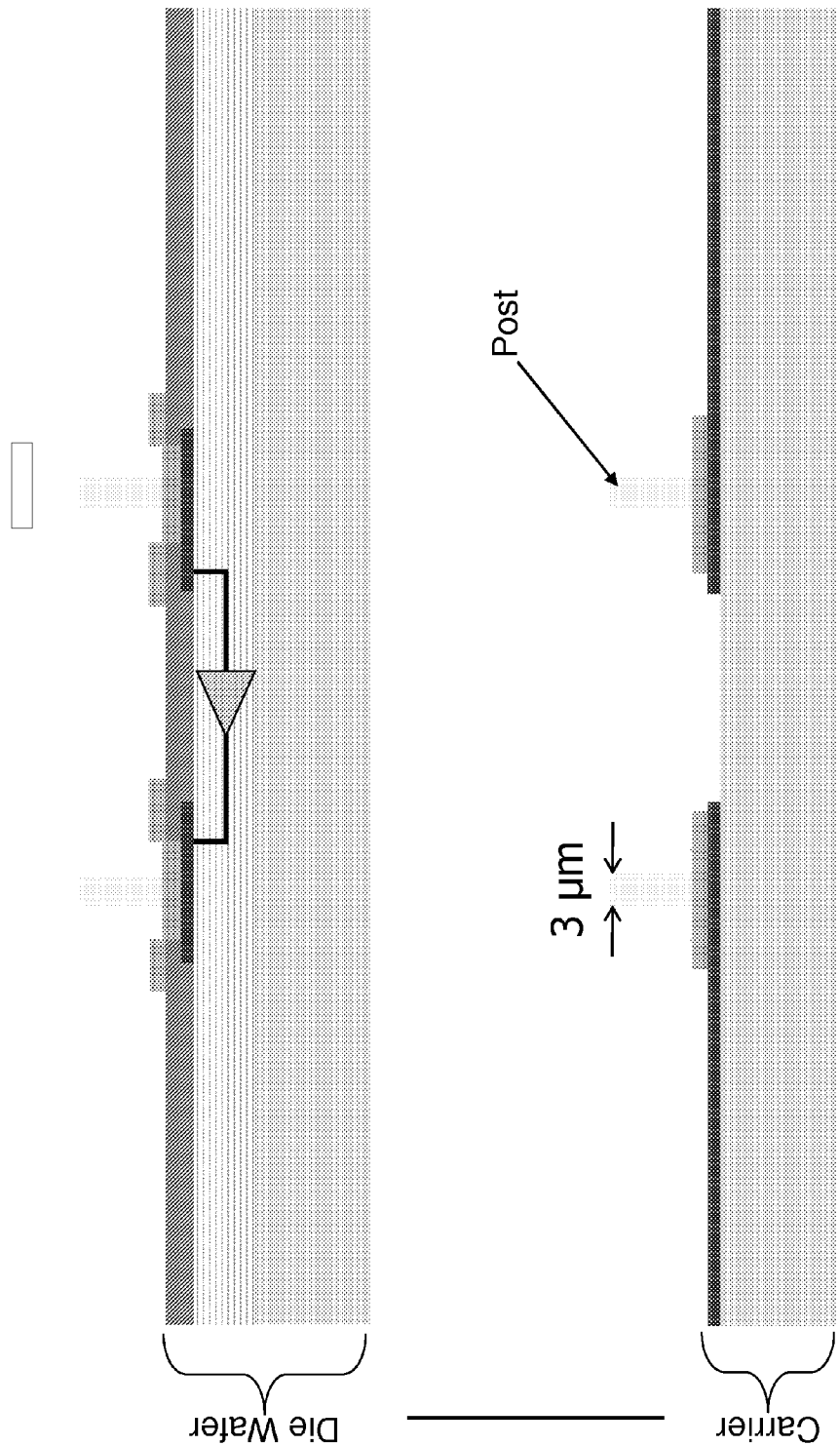
FIG. 5 shows a metallization and lift-off followed by a seed metal etching step according to embodiments of the present invention.

FIG. 5 shows a seed metal etch step according to embodiments of the present invention.

Figure 6:
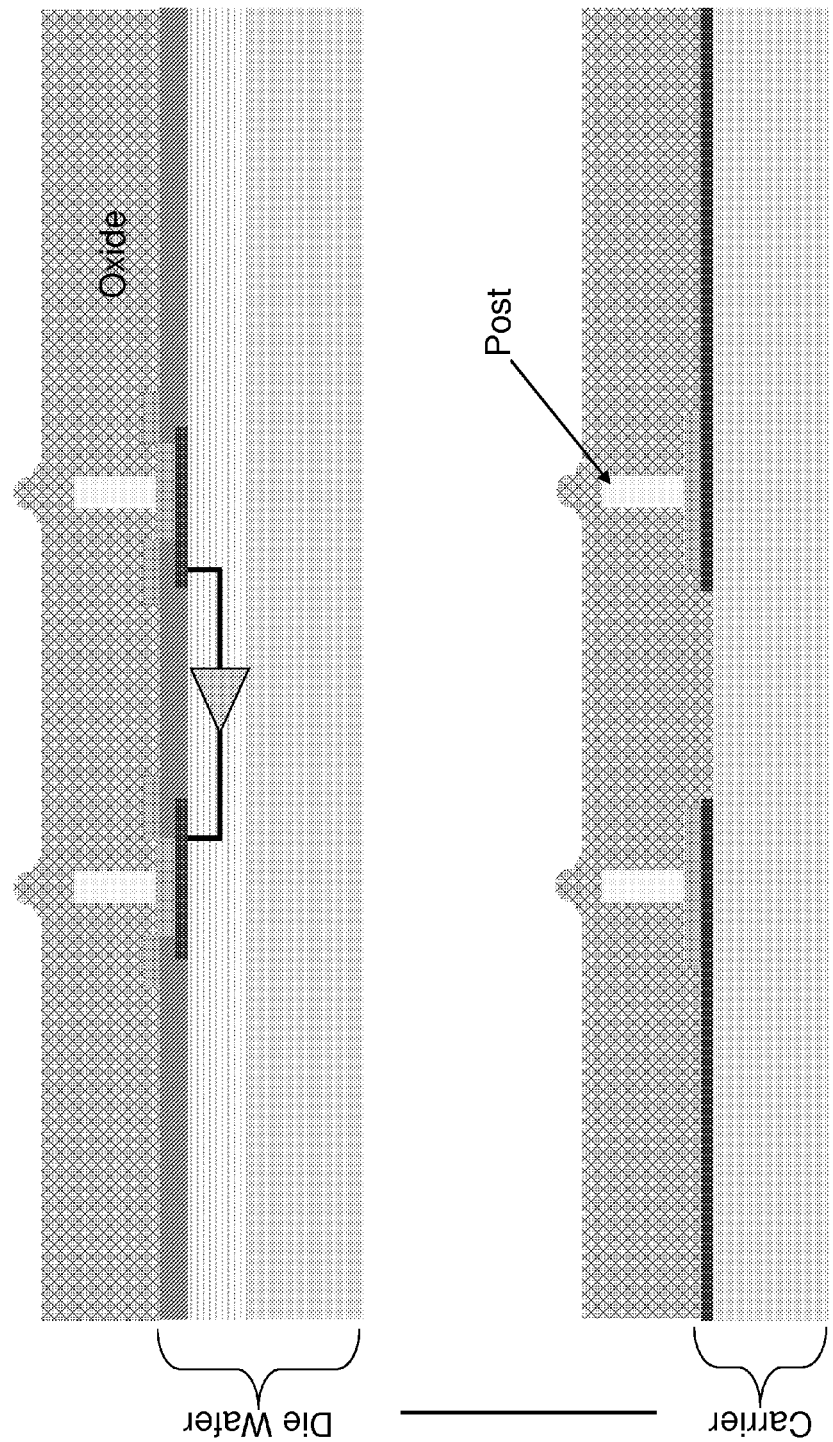
FIG. 6 depicts an oxide deposition step according to embodiments of the present invention.

FIG. 6 shows an oxide deposition step according to embodiments of the present invention.

Figure 7:
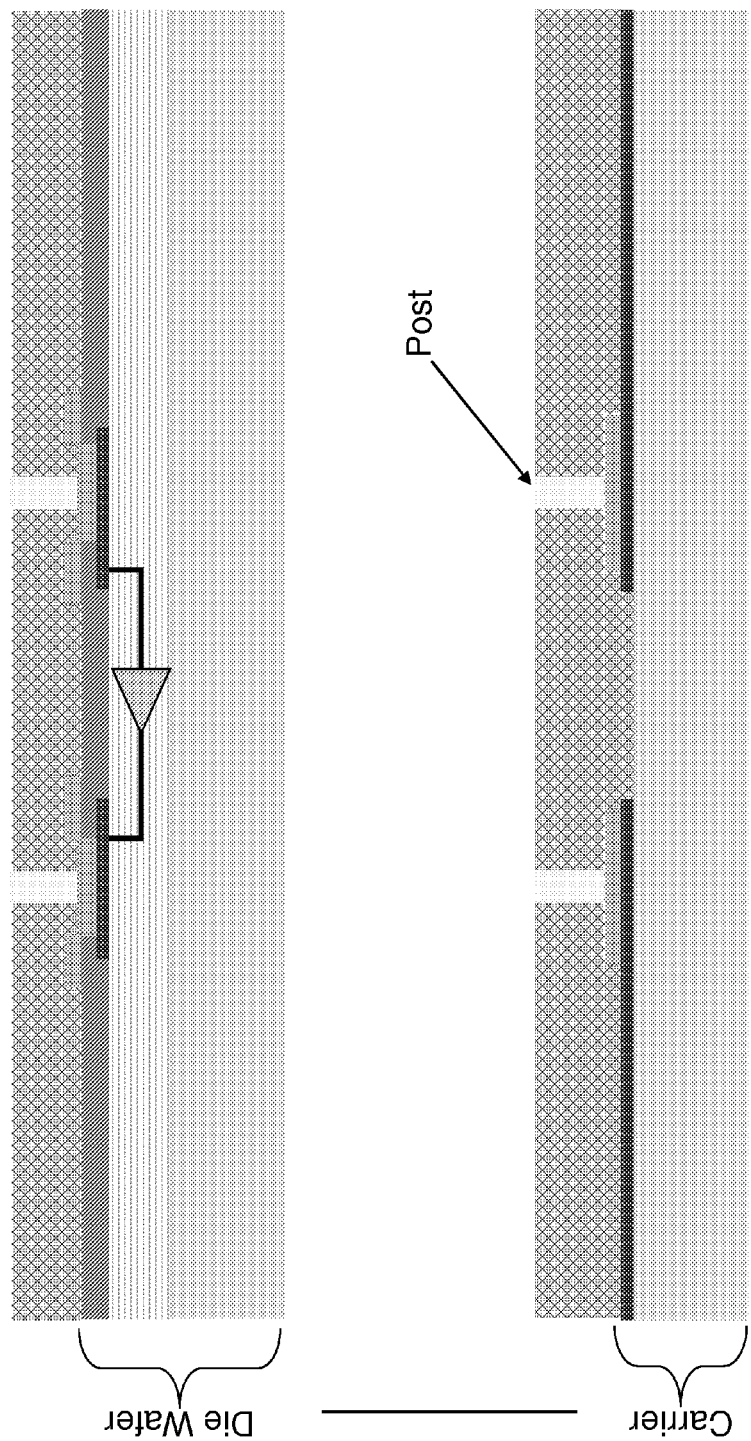
FIG. 7 illustrates a chemical mechanical planarization (CMP) process step according to embodiments of the present invention.

FIG. 7 shows a chemical mechanical planarization (CMP) process step according to embodiments of the present invention.

Figure 8:
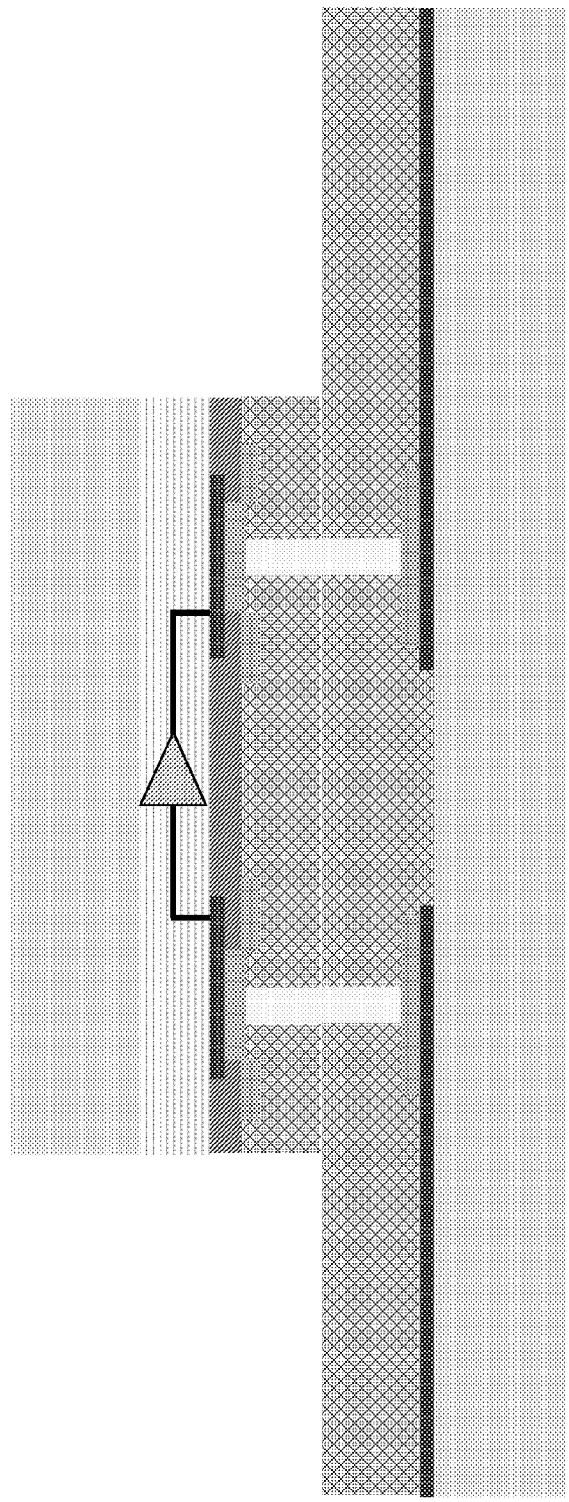
FIG. 8 shows singulation and die bonding steps according to embodiments of the present invention.

FIG. 8 shows singulation and die bonding steps according to embodiments of the present invention.

Figure 9:
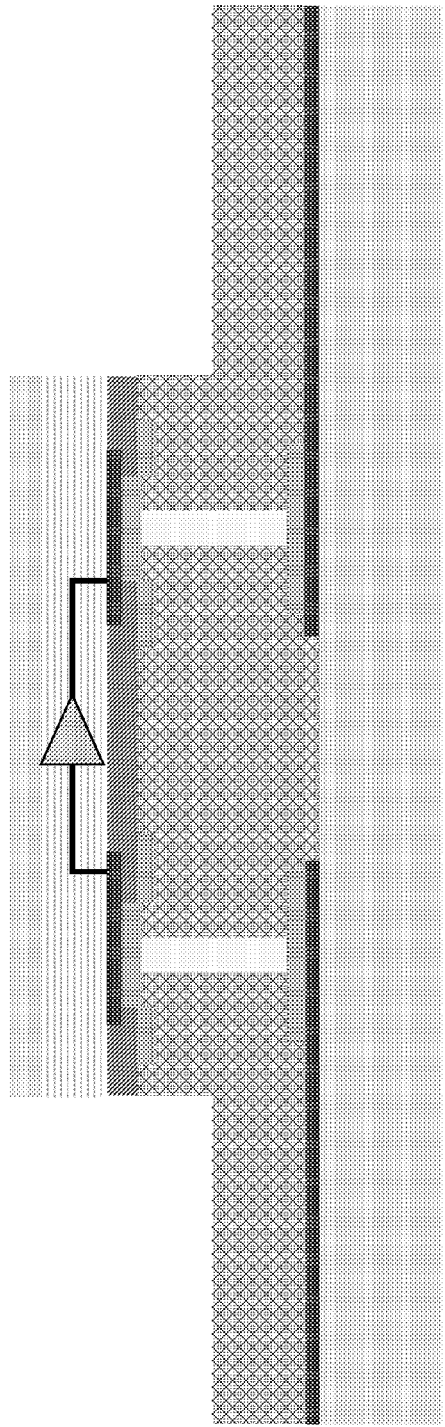
FIG. 9 shows an optional bonded die thinning step according to embodiments of the present invention.

FIG. 9 shows an optional bonded die thinning step according to embodiments of the present invention.

Figure 10:
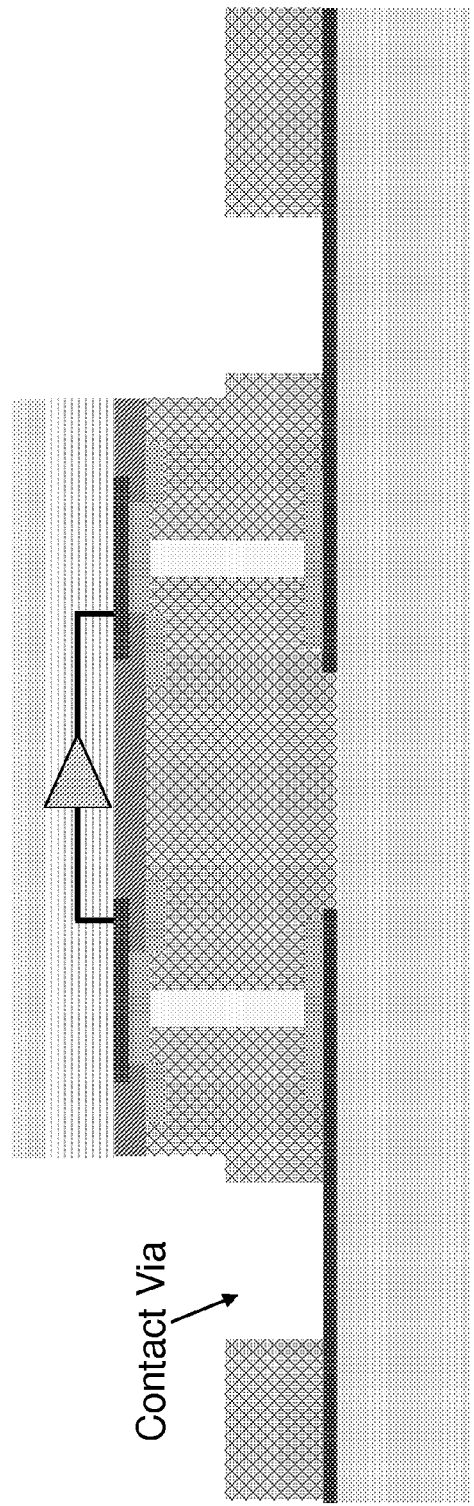
FIG. 10 shows a contact pad via etching step according to embodiments of the present invention.

FIG. 10 shows a contact pad via etching step according to embodiments of the present invention.

Figure 11:
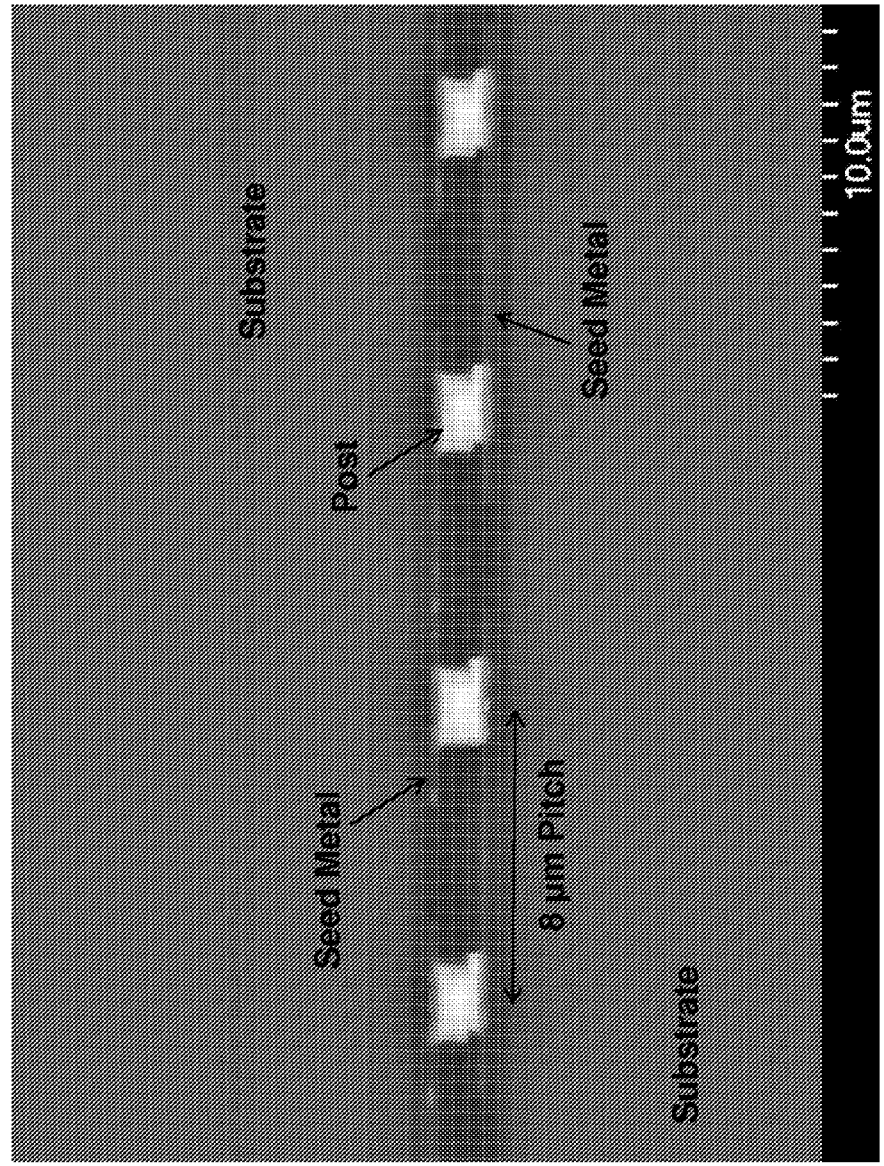
FIG. 11 shows a cross-sectional image of a FET according to embodiments of the present invention.

FIG. 11 shows a cross-sectional image of a FET according to embodiments of the present invention.

Figure 12:
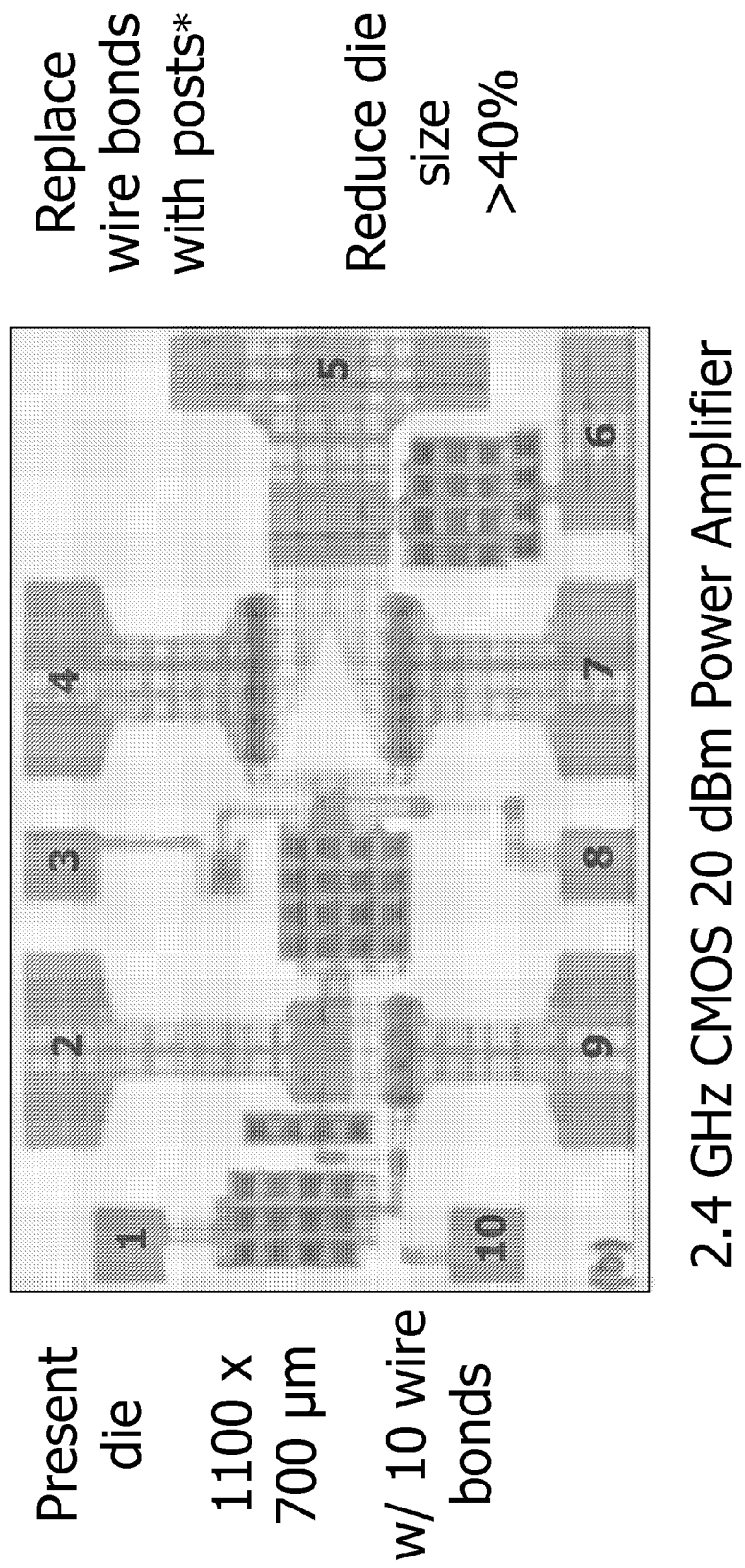
FIG. 12 depicts a typical monolithic microwave integrated circuit (MMIC).

FIG. 12 illustrates a typical monolithic microwave 1 integrated circuit (MMIC), including a photograph of a power amplifier. Its area and size extends to include about 10 pads around the periphery for connecting the chip to the circuit. This area for the pads may increase the overall size of a typical MMIC, when compared with the smaller MMIC application of the FET according to embodiments of the present invention, which may essentially eliminate any area associated with pads (i.e., outboard area), since they are positioned above the active area of the chip rather than outboard from it.

Figure 13:
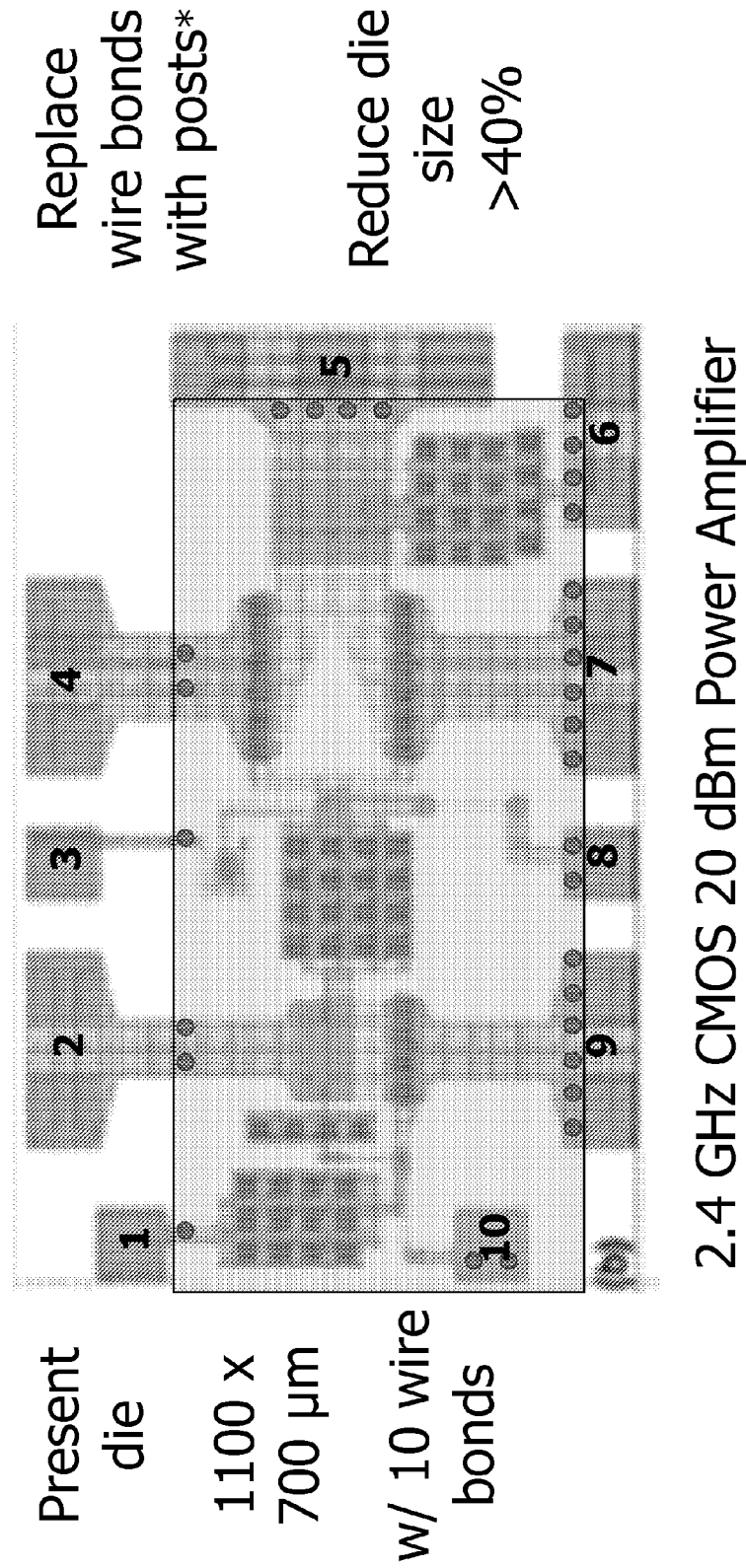
FIG. 13 illustrates a MMIC application of the FET according to embodiments of the present invention.

FIG. 13 illustrates an MMIC application of the FET according to embodiments of the present invention. The embodiments of the present invention may omit wire bonds and associated pads for connecting the device. Instead, embodiments may advantageously include posts, that functionally replace the wire bonds, and which are very small. For example, on a scale as illustrated in the FIG. 13, the posts are shown to be approximately thirty (30) times their actual size. Thus, FIG. 13 illustrates that the peripheral area may be significantly reduced. In this example, which may be representative of a typical number, the die area may be reduced by about 40%, due only to the elimination of the pad area required by typical devices.

In embodiments of the present invention, the MMIC device may be bonded to the interconnect substrate, with the posts included within that area (not outside in pad area), for making the connections to the circuit from the device via the posts. This illustrates how the devices may be made smaller and therefore cheaper. Other advantages may include that the board, carrier, or interconnect substrate area is correspondingly reduced, because the connections to the MMIC are positioned underneath the chip by at least about the same amount as for the MMIC illustrated in FIG. 13. The size savings is advantageous, because the MMICs on their corresponding interconnect substrates are often used in smaller devices like mobile phones, where reduction in size of the final electronic device may be commercially important and valuable. The wire bonds themselves may often be a source of failure because if the bonds are not connected properly, they fail, which in turn causes device failure. Since the wire bonds are inductive, they also parasitically degrade the device performance. Such wire bonds may be omitted in the FET devices and their applications according to embodiments of the present invention. In embodiments of the present invention, the elements of the device may be encapsulated in silicon dioxide. In embodiments of the present invention, an external package may be not needed, which saves size and cost. While not depicted in FIG. 13, the present invention may provide a FET and applications where it is possible to make connections anywhere on the die surface, rather than just the edges of the chips. This may further advantageously allow for manufacturers of devices to simplify their design, which includes many benefits. Examples include lower material cost associated with the die and board; higher yield, due to elimination of assembly failures; better performance, due to the elimination of connection parasitics; more reproducible performance because of the elimination of connection variations; better reliability; and the advantage of multi-chip on-wafer assembly.

Figure 14:
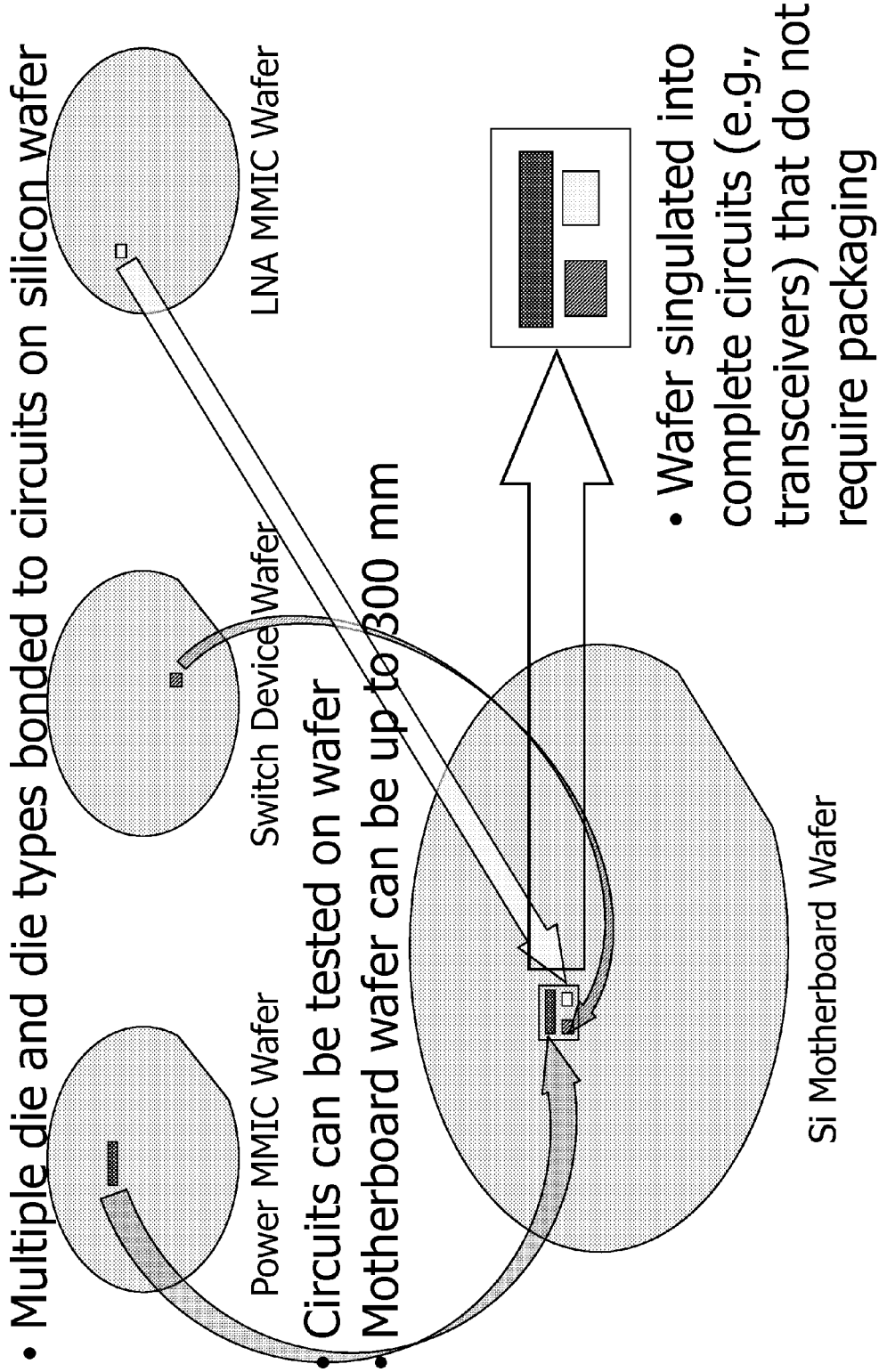
FIG. 14 illustrates a multi-chip assembly flow diagram according to embodiments of the present invention.

FIG. 14 illustrates a multi-chip assembly flow diagram. Various devices are shown which may be individually bonded onto the interconnect wafer (identified as a motherboard in the figure) to create a multi-component that may be tested on wafer. Furthermore, it may be assembled into packaging. This may save space, cost, and component count while at the same time improving performance by reducing interconnection parasitics.

Figure 15:
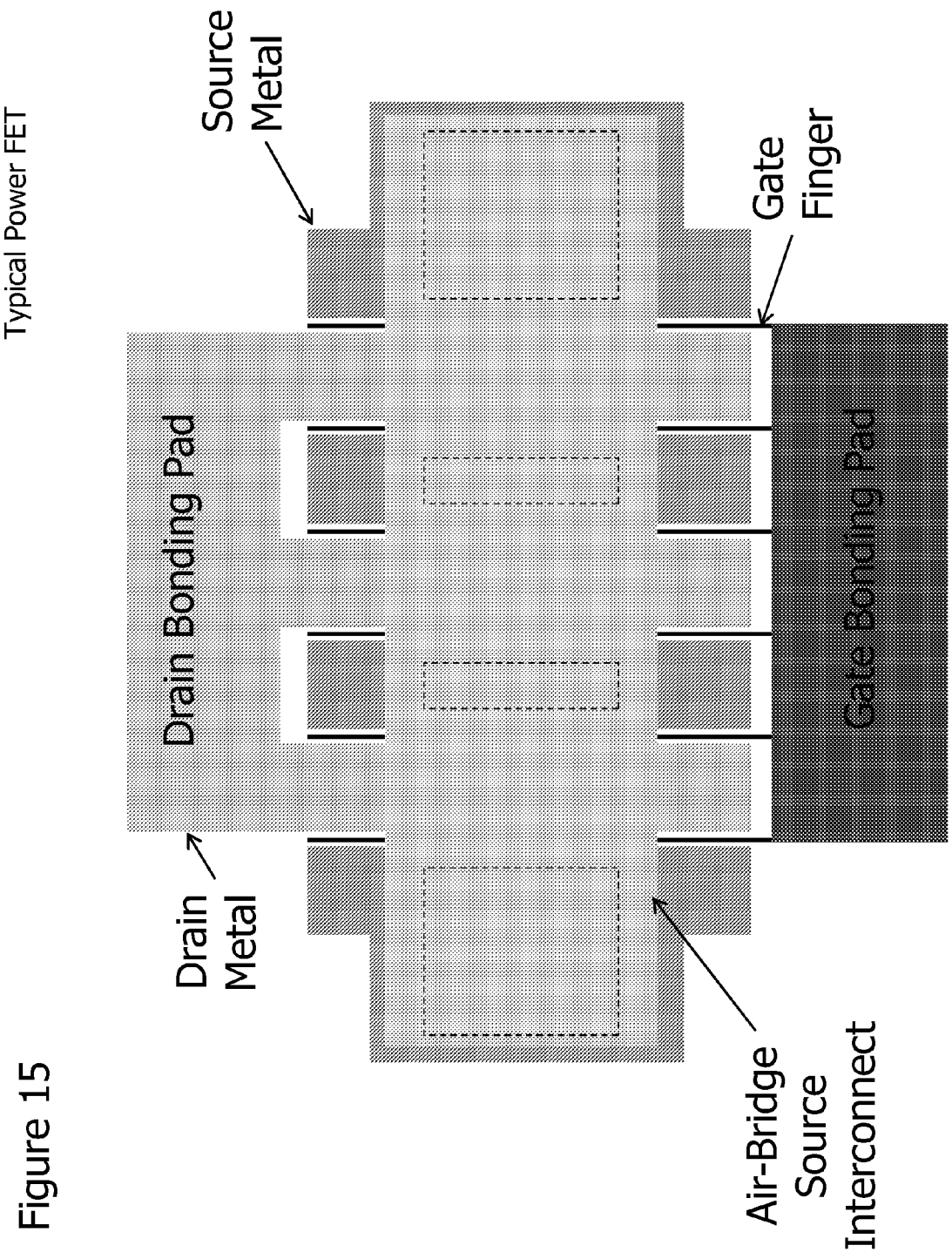
FIG. 15 shows a typical power FET.

FIG. 15 is a diagram of a typical power FET, illustrating components such as drain bonding pad, gate bonding pad, source metal, drain metal, air bridge source interconnect, and gate fingers. There may be problems associated with the typical power FET layout, including the following:

1) regarding air-bridge interconnect, air-bridge interconnect may be a complicated multi-mask process, which drives the width of the source fingers to be greater than would otherwise be necessary (and the gold plating used may be expensive);
2) regarding bonding pads, the drain and gate pads outboard from the active device, which increases the overall chip area; and the outboard source pads necessary for bonding or via-holes also increase chip size;

3) the drain fingers may be too wide (~30 µm) to handle high current flow along their length;

4) the gate fingers are fed from one side, which increases the gate finger resistance and reduces the yield.

Figure 16:
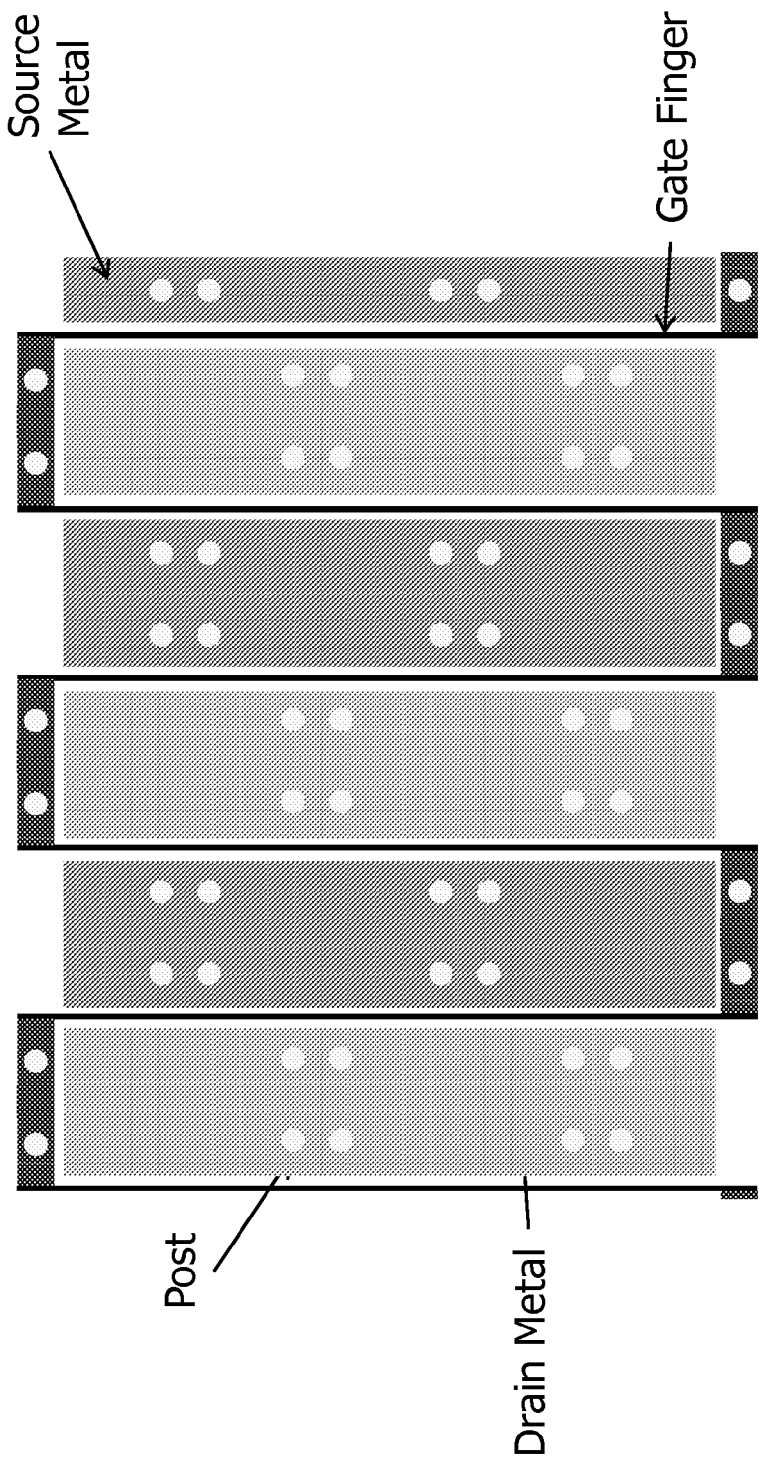
FIG. 16 illustrates a post pattern on a device wafer according to embodiments of the present invention.

FIG. 16 illustrates a post pattern on a device wafer according to embodiments of the present invention.

Figure 17:
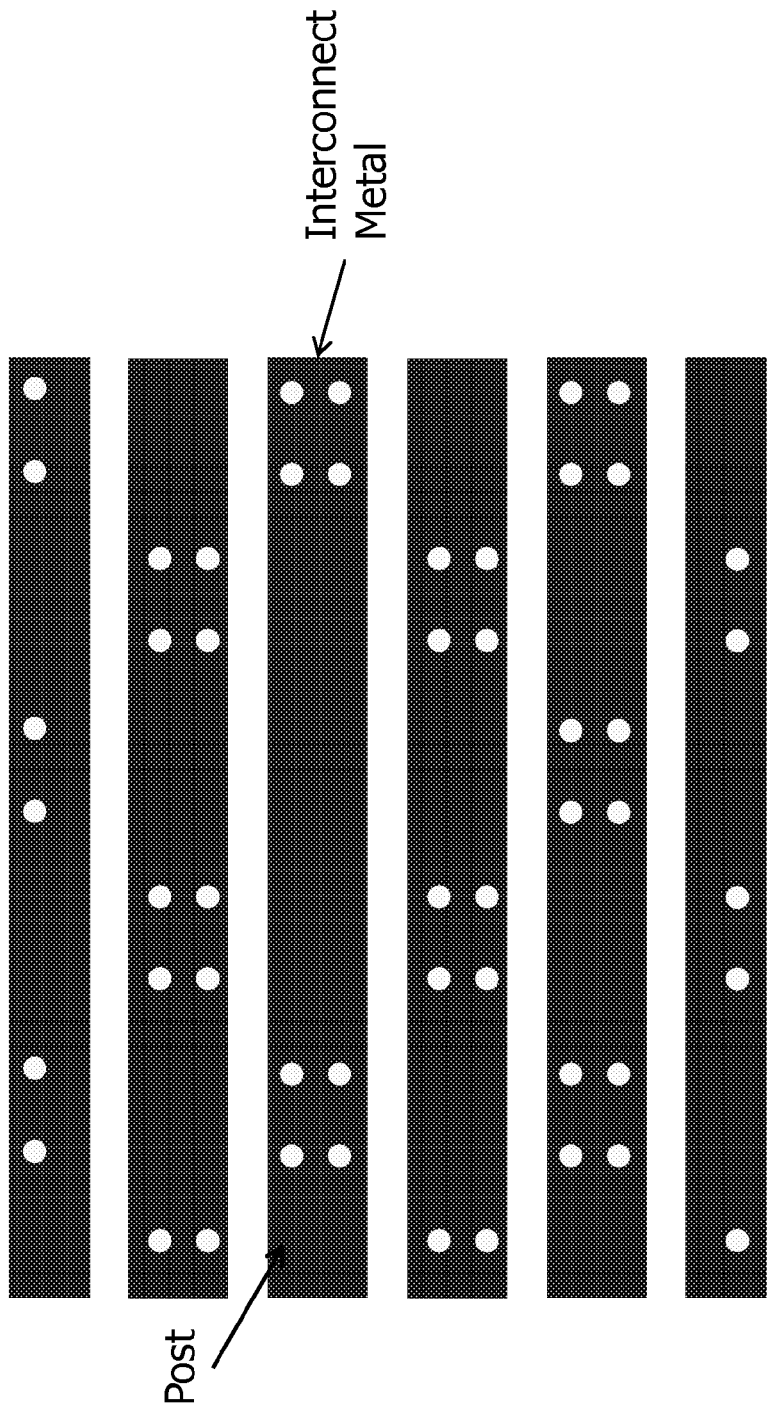
FIG. 17 illustrates a post pattern on an interconnect substrate according to embodiments of the present invention.

FIG. 17 illustrates a post pattern on an interconnect substrate according to embodiments of the present invention. The layout may enable manufacturing of embodiments including a post-to-post bonding design. If die-to-wafer bonding is not required, then there may be no need to use the post-to-post bonding. Rather, the interconnect structures described as being on the interconnect wafer can, instead, be simple metal layers fabricated directly on top of and above the posts on the device wafer. Nevertheless, the device structure and layout according to embodiments of the present invention have further advantages, as discussed herein.

Figure 18:
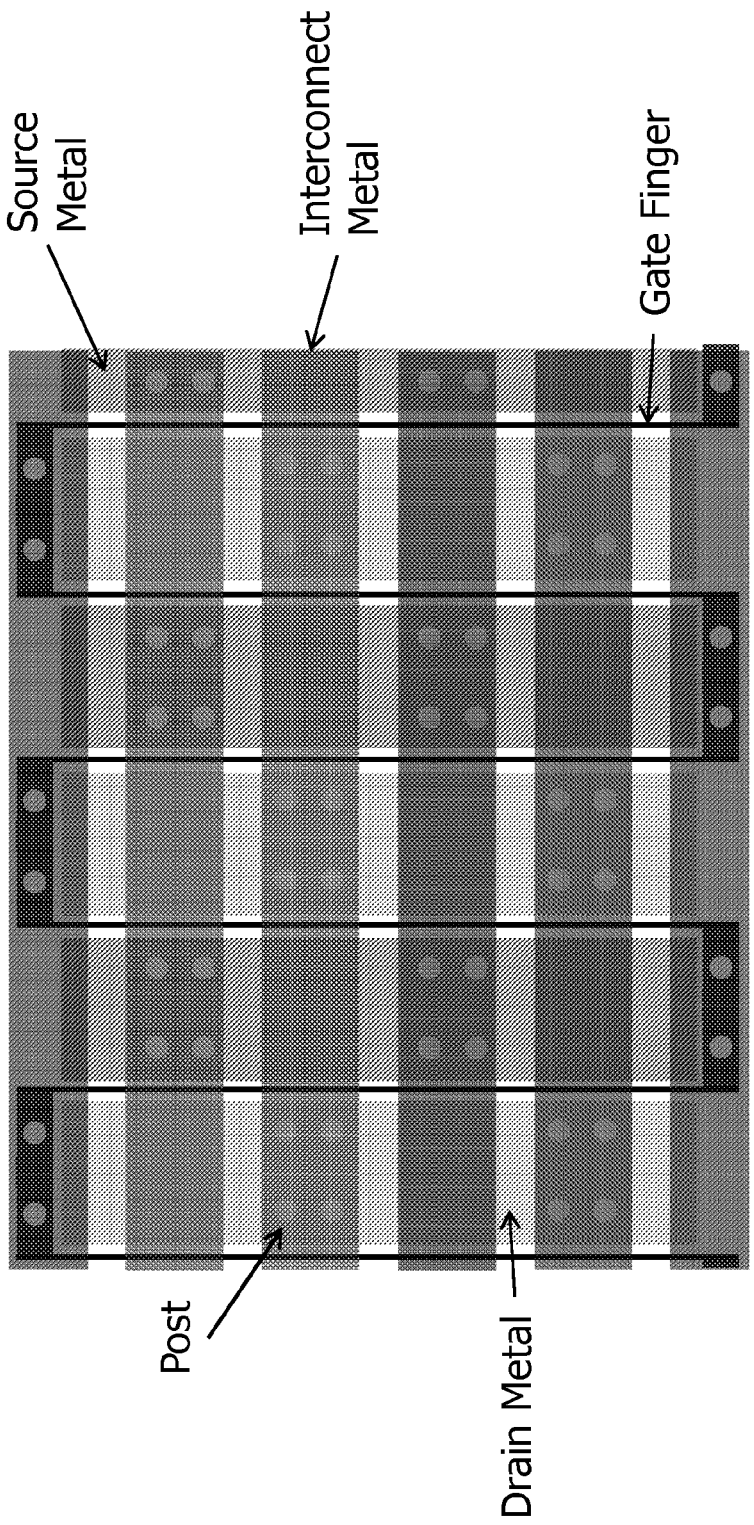
FIG. 18 illustrates a bonded structure for a FET according to embodiments of the present invention.

FIG. 18 illustrates a bonded structure for a FET according to embodiments of the present invention.

Figure 19:
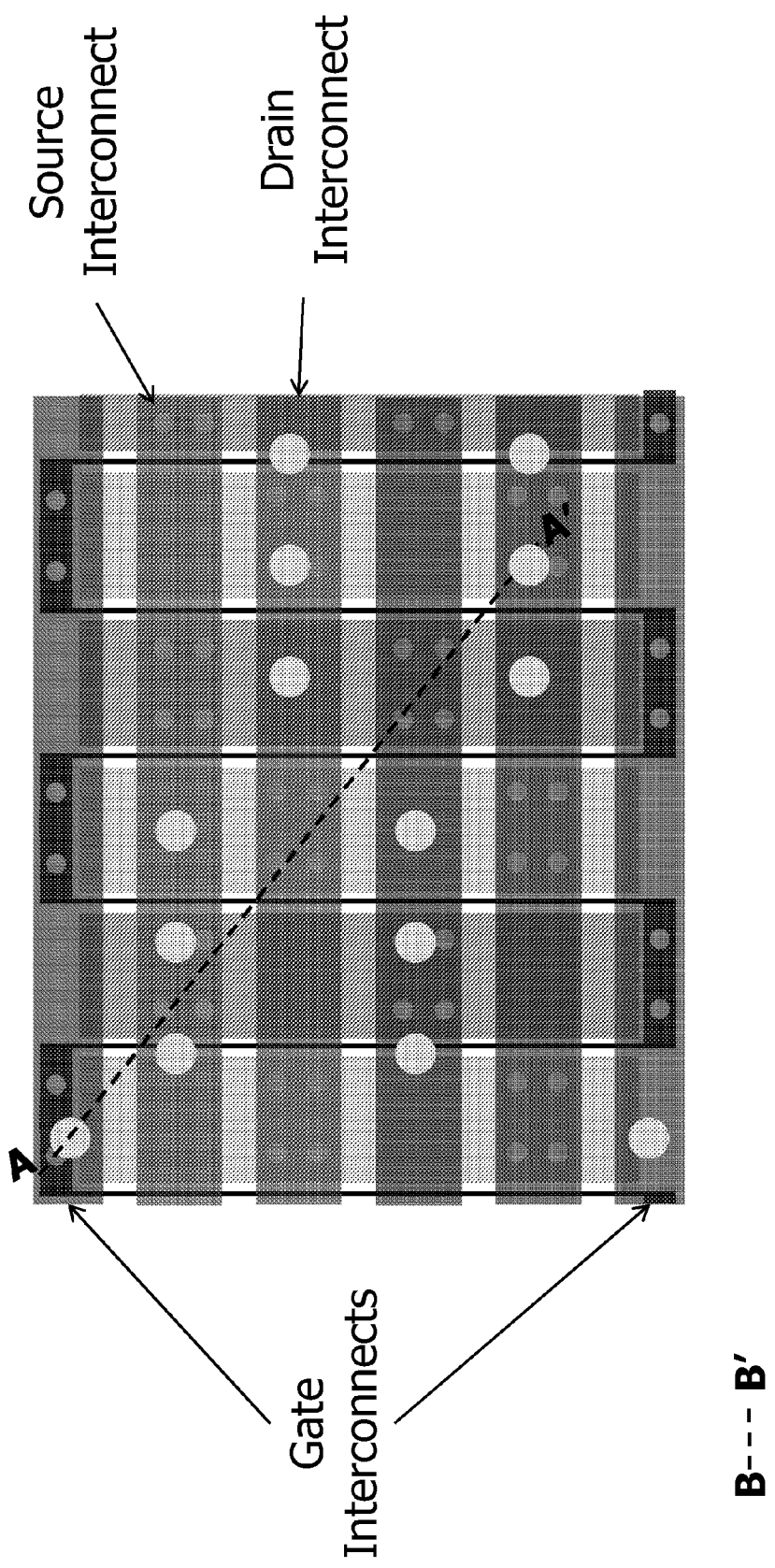
FIG. 19 shows a cutaway view of copper vias between first and last metal layers according to embodiments of the present invention.

FIG. 19 shows a cutaway view of copper vias between first and last metal layers according to embodiments of the present invention.

Figure 20:
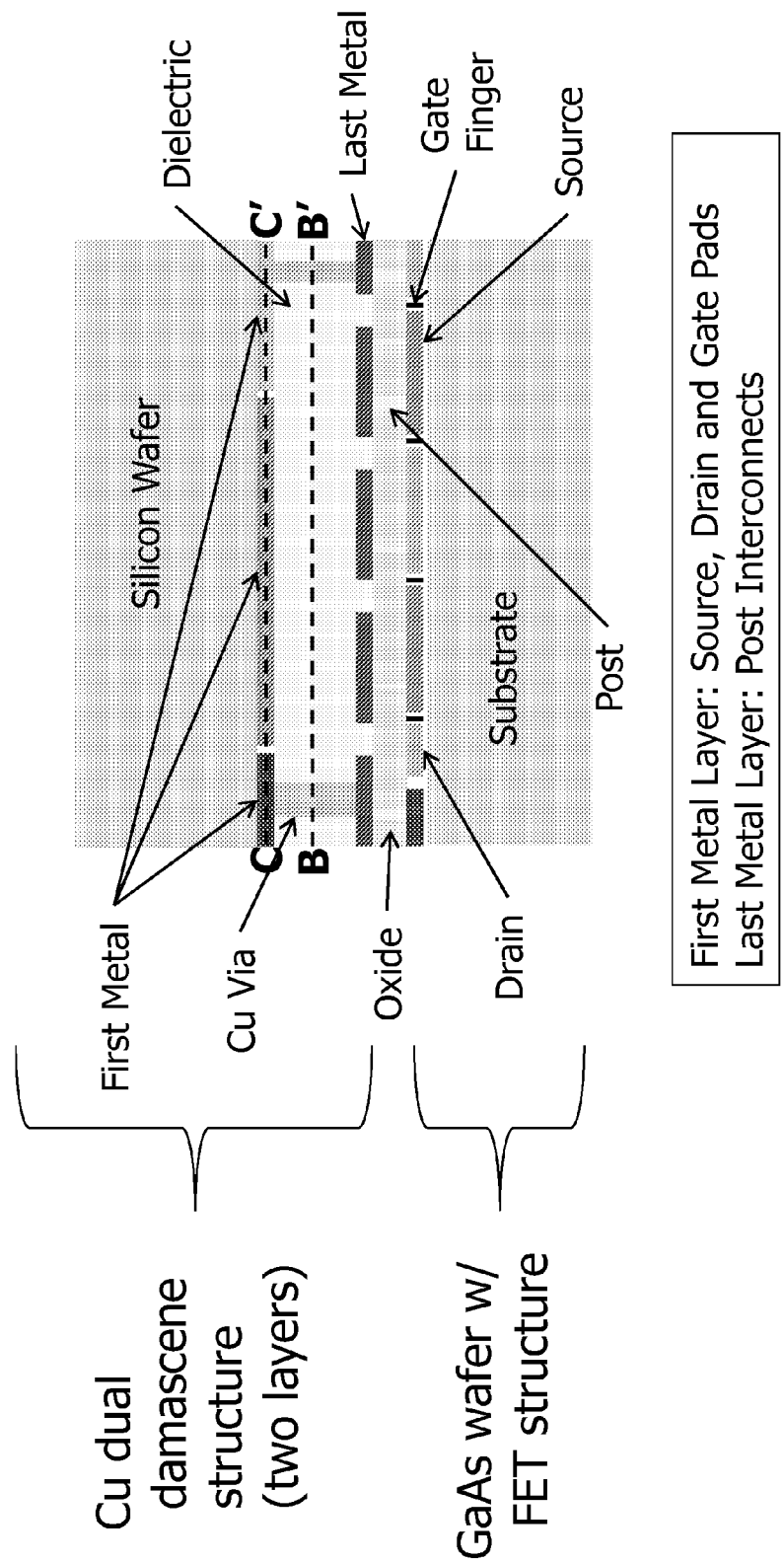
FIG. 20 illustrates a cross-sectional view of the bonded structure illustrated in FIG. 19.

FIG. 20 illustrates a cross-sectional view of the bonded structure illustrated in FIG. 19.

Figure 21:
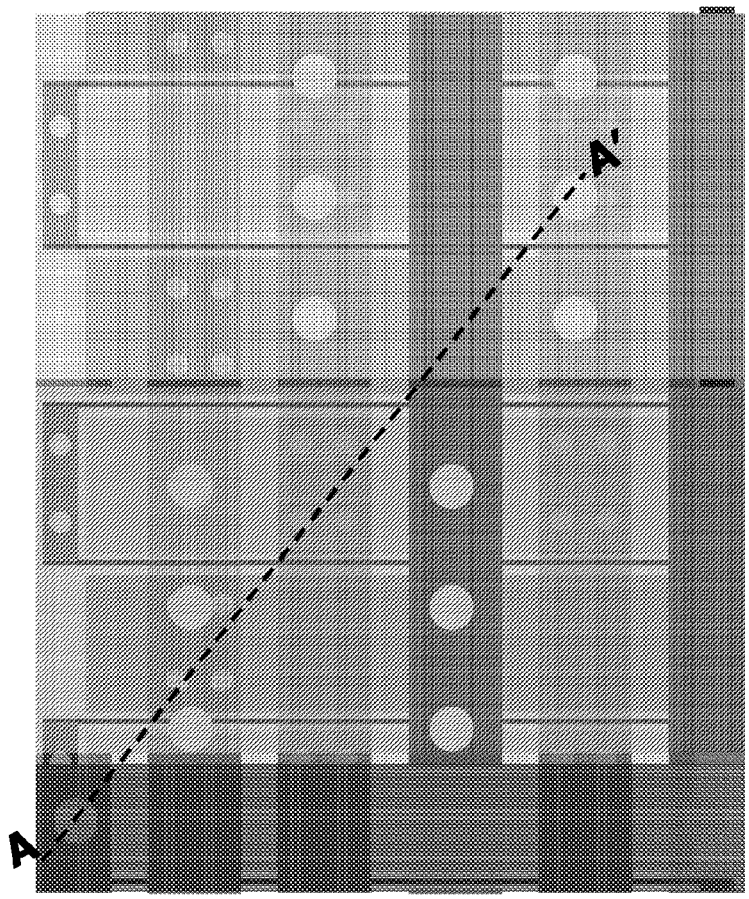
FIG. 21 shows a cutaway view of a first metal layer illustrated in FIG. 20.

FIG. 21 shows a cutaway view of a first metal layer according to embodiments of the present invention in FIG. 20.

Figure 22:
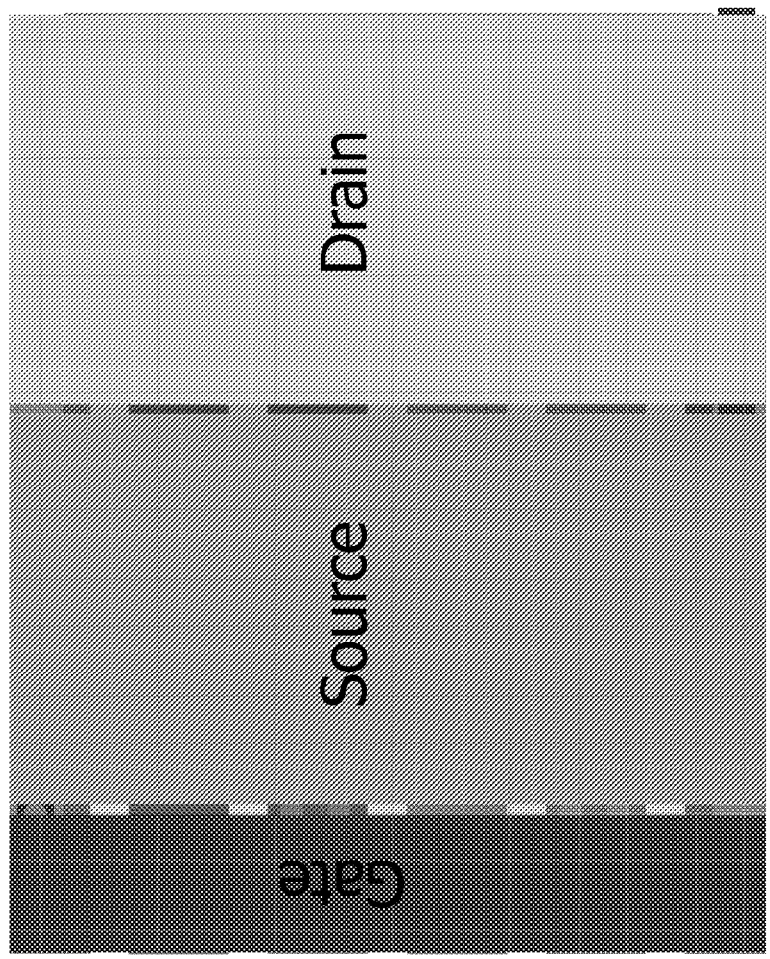
FIG. 22 illustrates a power FET according to embodiments of the present invention.

FIG. 22 illustrates a power FET which may be surface mounted according to embodiments of the present invention.

Figure 23:
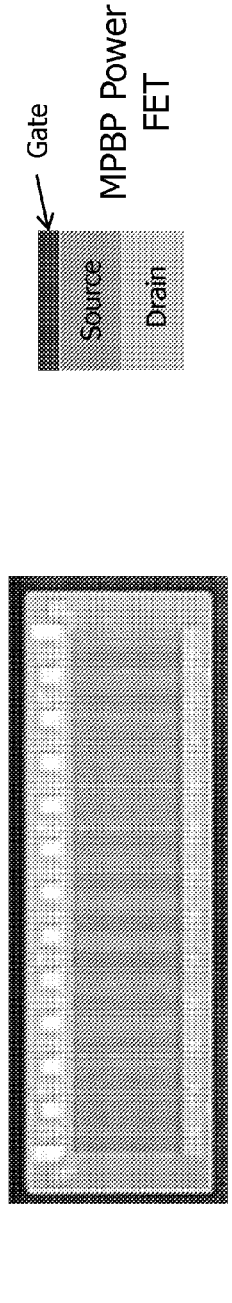
FIG. 23 illustrates a comparison between a typical power FET and a power FET according to embodiments of the present invention.

FIG. 23 provides a comparison between a typical FET and a Sarda design power FET according to embodiments of the present invention and includes Table 1.

Figure 24:
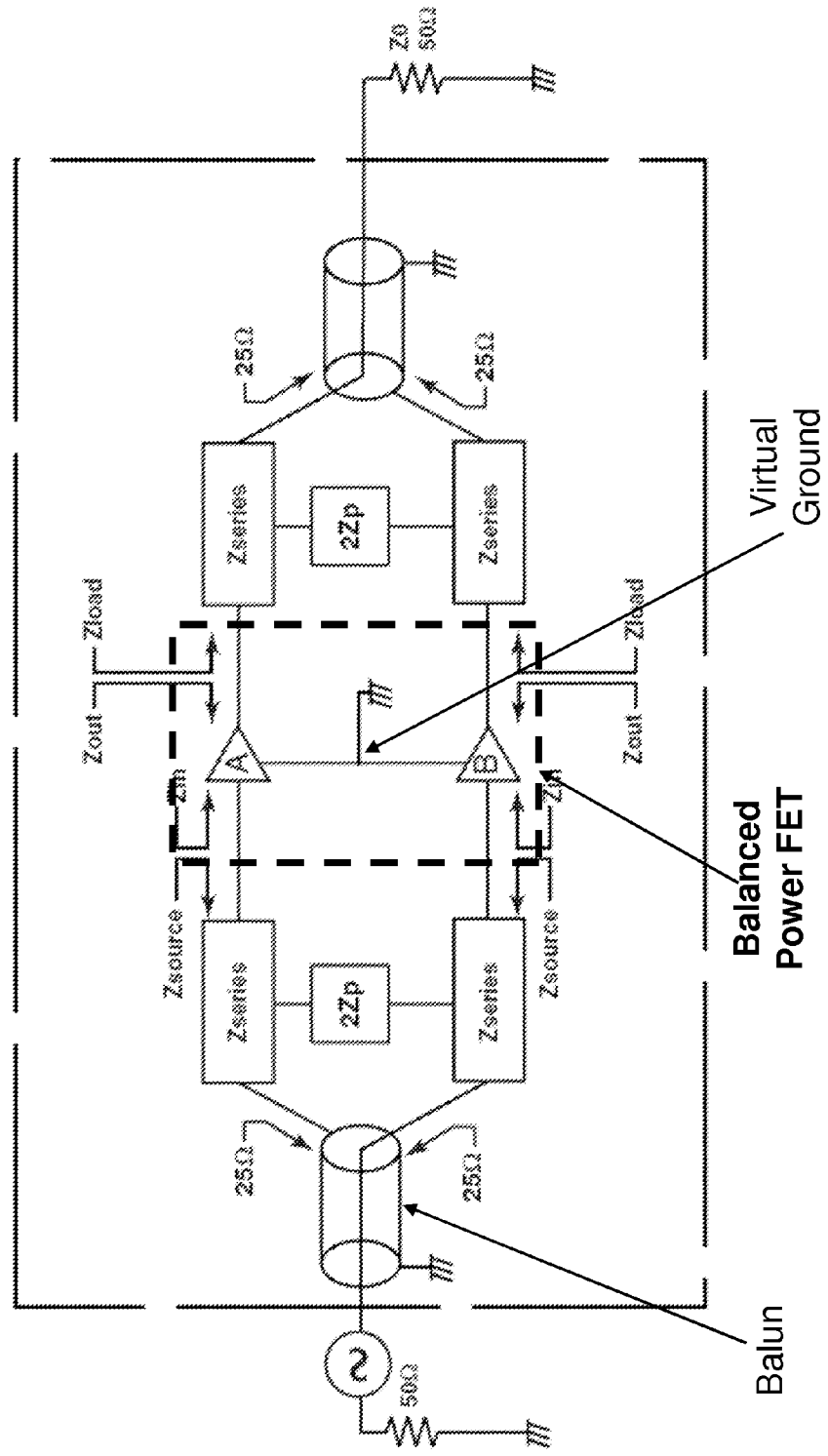
FIG. 24 is a schematic diagram of a push-pull amplifier including a typical balanced pair of power FET devices.
Figure 25:
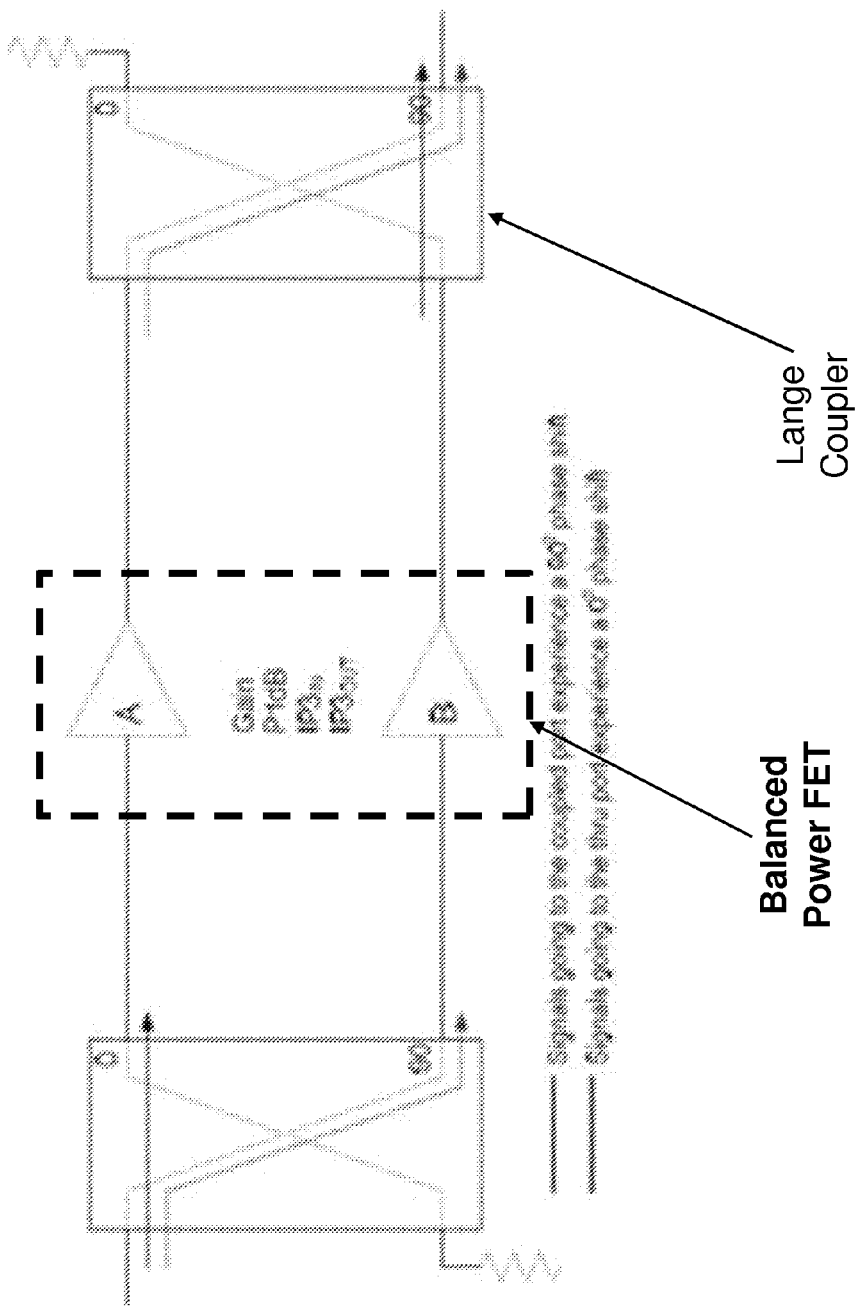
FIG. 25 is a schematic diagram of a balanced amplifier including a typical balanced pair of power FET devices.

Power amplifiers may comprise a pair of power FET devices according to embodiments of the present invention in a push-pull amplifier configuration incorporating balun combiners as shown in FIG. 24, or in a balanced configuration typically using quadrature couplers such as a Lange coupler as shown in FIG. 25. In either case, the two devices should be as closely identical (e.g., electrically) as possible in power, gain, and linearity at high frequency to yield optimum amplifier performance. However these parameters cannot be measured in individual chips on a wafer, so matched pairs of devices cannot be preselected. Variations in the electrical characteristics of devices across the wafer are due to process and/or mechanical variations, but these are not abrupt. Thus, adjacent devices will typically be better matched electrically than, for example, pairs selected at random. Even devices that are adjacent on the wafer will not be perfectly matched as they are spread out, and not nearly as compact as with embodiments of the present invention. If a process step includes cutting the die with two devices on each die, and one device may be bad, then both are lost, which produces yield losses. In contrast, embodiments of the present invention and the gates thereof may not have this problem, so there may not be substantial yield impact.

Figure 26:
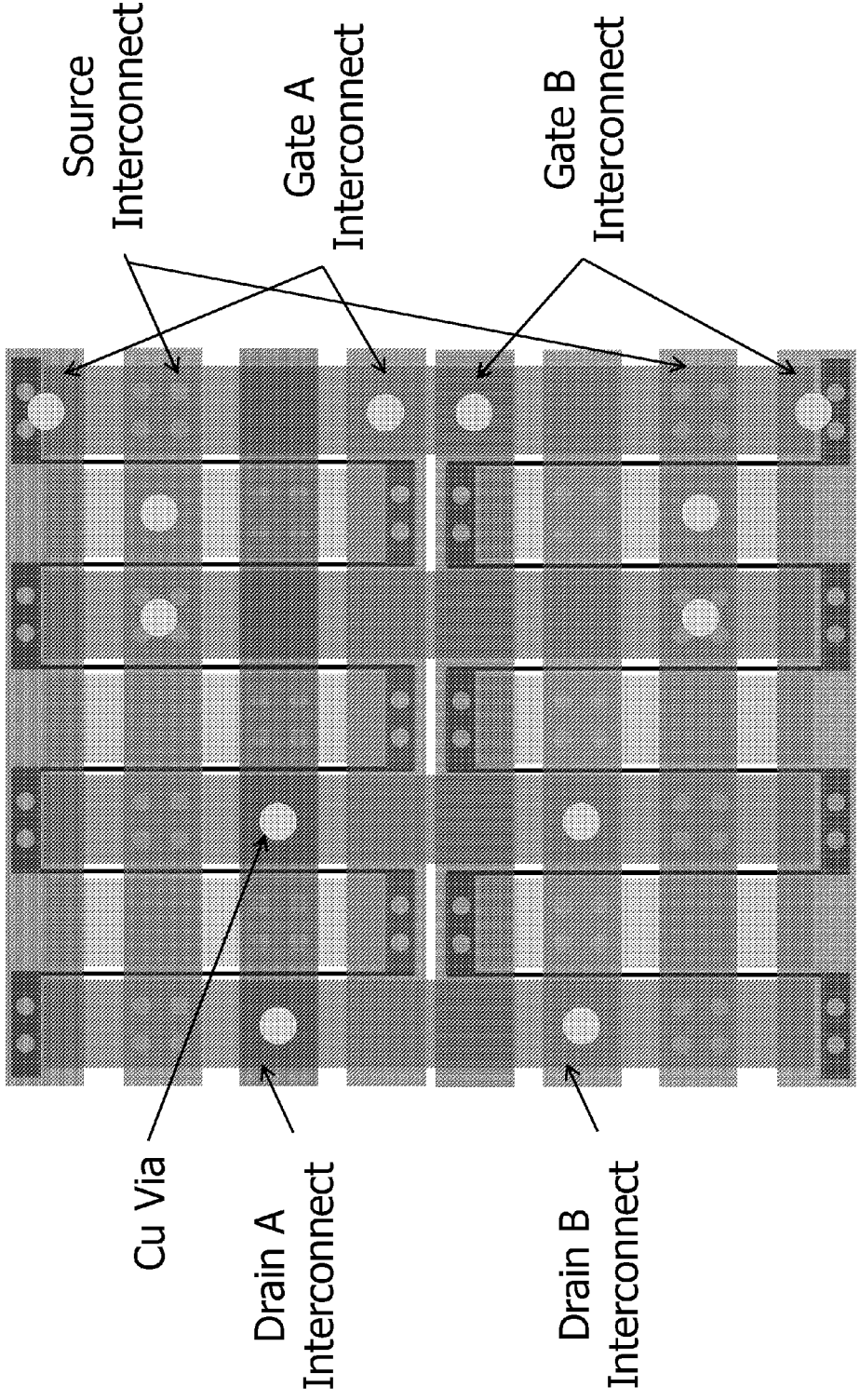
FIG. 26 illustrates post connections between first and last level metal according to embodiments of the present invention.

FIG. 26 illustrates post connections between first and last level metal on embodiments of the present invention. The interconnection scheme may be shown, with the vertical lines providing a configuration as close as possible to a common ground. This may contribute to stability (i.e., if the chips are physically apart, and there may be a slight difference in the ground path, it may cause oscillation and instability in the amplifier). Accordingly, this balanced power FET may be identical to two single FETs, with two inputs, two outputs, and a common ground as shown.

Figure 27:
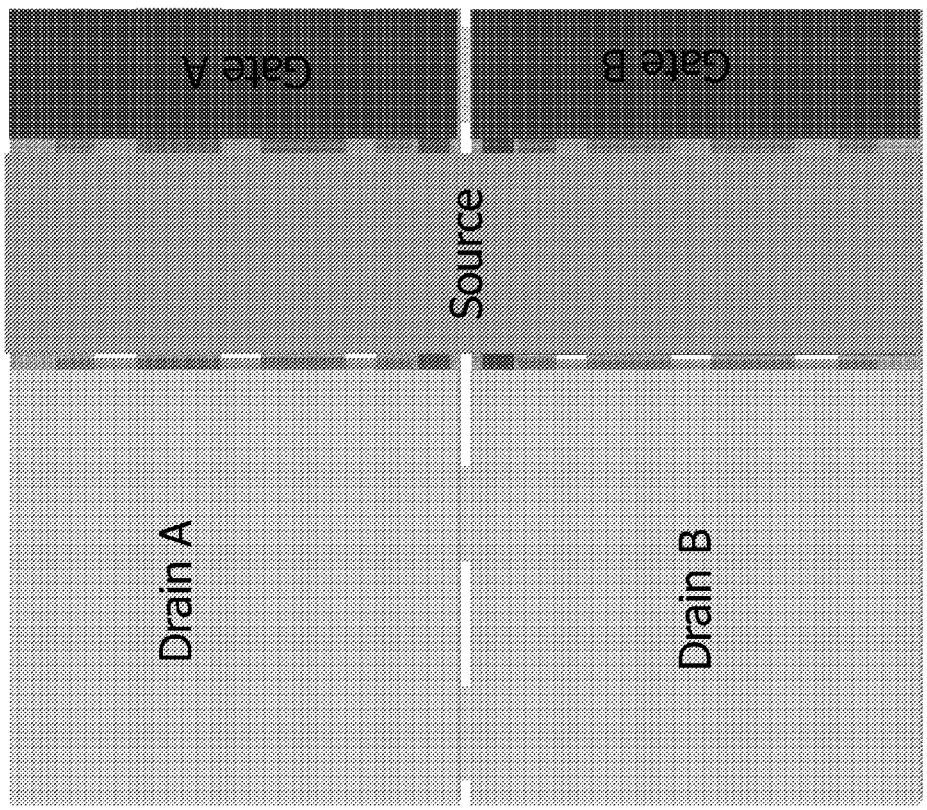
FIG. 27 depicts a balanced power FET first level metal view according to embodiments of the present invention.

FIG. 27 illustrates a balanced power FET first level metal view according to embodiments of the present invention. The advantages may include the same advantages of the power FET embodiments of the present invention, which may provide a chip for balanced or push-pull amplifier applications, wherein the devices are physically right next to each other on the wafer, so they may be a high probability of them having identical characteristics, which may be ideal for matching; a true common source on the chip minimizes possible oscillations that would otherwise exist; wire bond inductance may be eliminated with the present invention, which further minimizes oscillations; and the Lange couplers or baluns may be integrated into the interconnection substrate, thereby eliminating separate components.

Figure 28:
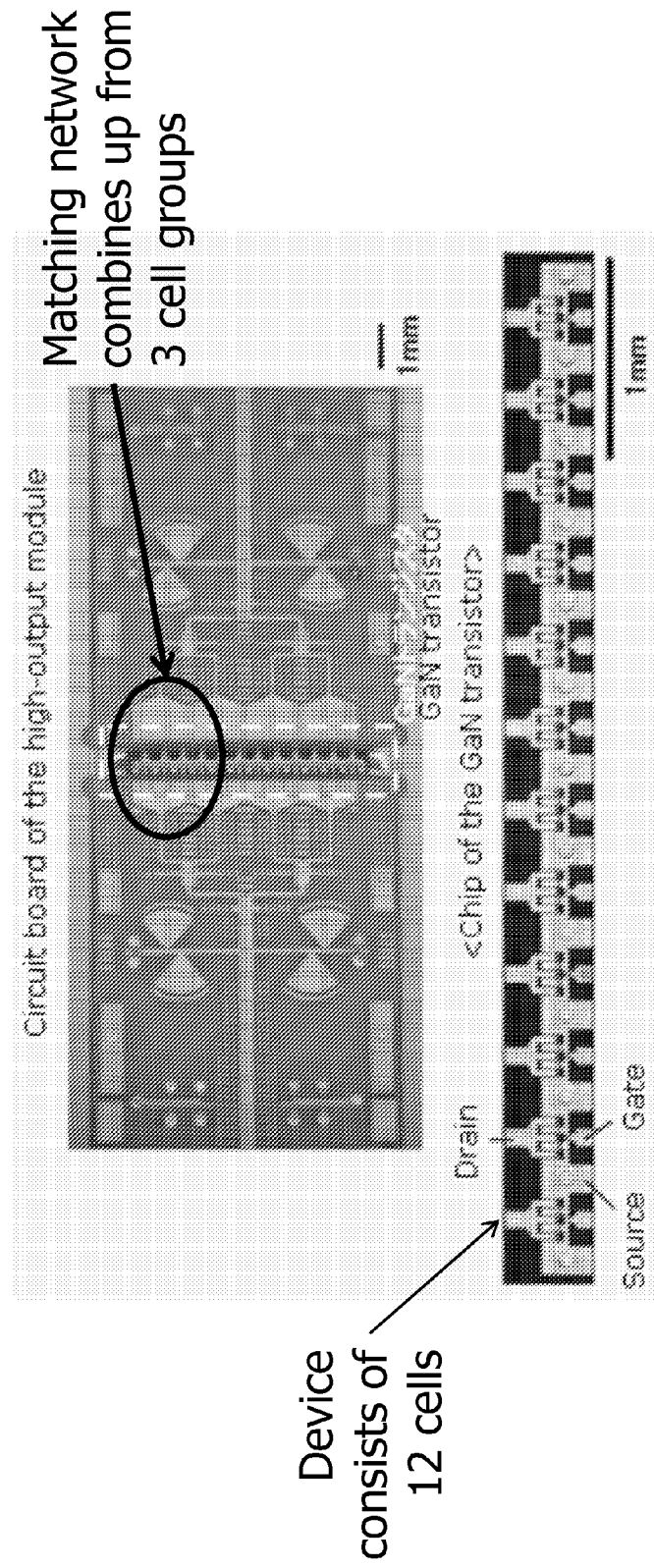
FIG. 28 illustrates a typical power amplifier circuit board.

For a typical power FET, the more gate periphery it has the more power it can generate, but the lower its output impedance will be (a few Ohms or even less). The impedance level of the device may be matched to 50 Ohms. The bigger the difference between the device output impedance and 50 Ohms, the more difficult the matching and the greater the loss of device performance will be. Overcoming a large initial mismatch may include multiple stages of matching, further degrading performance. As a result, large power devices are normally a collection of smaller cells, with individually higher output impedances, connected using a branching tree matching network. FIG. 28 provides an example illustration of a circuit board including a typical Power FET. The chip may be especially long in the vertical direction because there may be a ground point between each of the cells providing the space needed for the via holes in the chip that are used to reach the electrical ground which may be on the back side. Branching of cells may be common in power devices.

Figure 29:
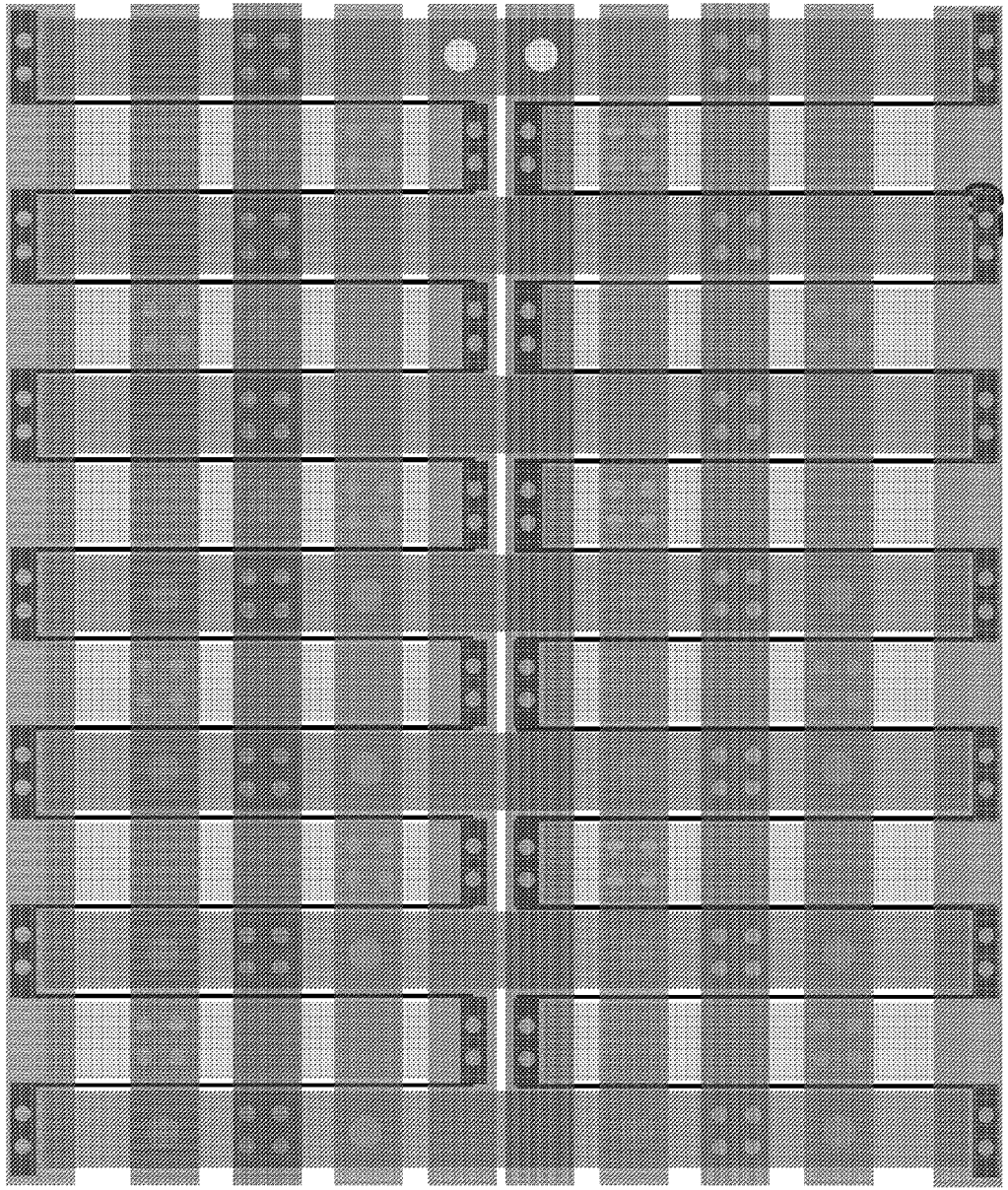
FIG. 29 shows post connections between first and last level metal according to embodiments of the present invention.

FIG. 29 shows post connections between first and last level metal according to embodiments of the present invention. There may be two separate inputs (or one strapped together) and 2 times n outputs, where n could be from 1 to 8 (or more).

Figure 30:
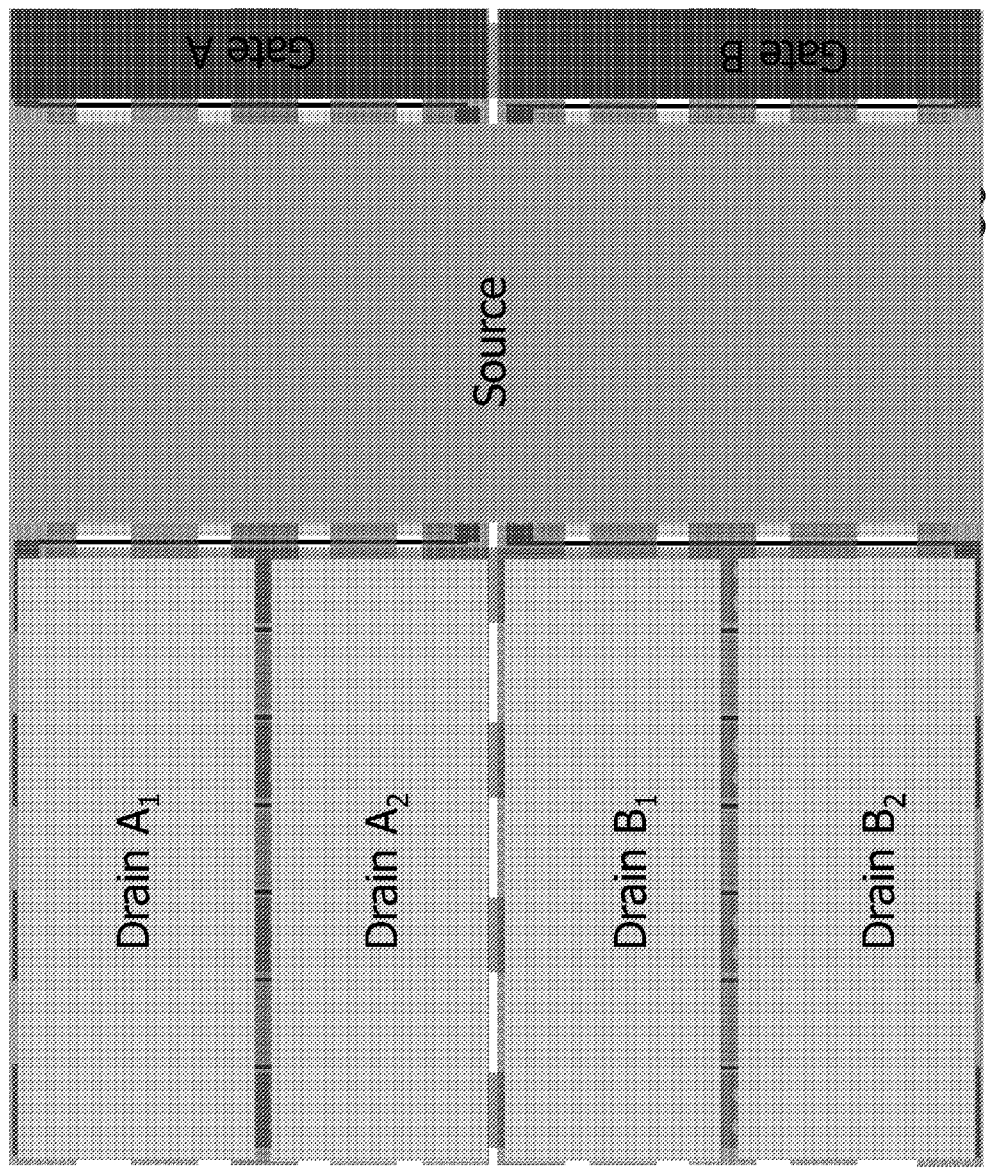
FIG. 30 shows a multi-port power FET first level metal view according to embodiments of the present invention.

FIG. 30 shows a multi-port power FET first level metal view showing two inputs and four outputs according to embodiments of the present invention.

FIG. 31 illustrates a comparison between the device in FIG. 31 and the multi-port power FET according embodiments of the present invention. In this case, the same amount of gate periphery may be in each one of the output connections as in each initial node of a typical device output branching network, but in a much smaller size die. Thus, the goal of increasing the impedance of each of the sections of the device may still be achieved, but with an area-efficient layout. For example, the die may be eight times smaller. The aspect ratio of a typical device may be 11:1, making this chip (which may be typically only 0.1 mm thick) extremely difficult to handle without breaking it. In the present invention, handling may be easier because the die may be nearly square when compared with a typical rectangular geometry, shown in the Figure. In addition to easier handling, there are 24 wire bonds to connect with a typical device on the left side of the figure. In contrast, the present invention may not have wire bonds, so there are advantages with respect to matching. Regarding electrical performance along the length, there may be variation, so the more spread out the device is, the more dephasing that will exist along the long dimension. Thus, the combined effect with these improvements may produce an amplifier with better performance.

Nearly every piece of contemporary electronics includes at least one DC-to-DC converter. A DC-to-DC converter may take a supply voltage and steps it down to the voltage(s) required by other components in the system. Regardless of which voltage(s) is provided, a different voltage may be needed within the electronic equipment (e.g., in a computer there are components including the processor, memory chips, DVD drive, etc. all of which may need different voltages). The conversion efficiency of the circuit (the DC-DC converter) that supplies those voltages may be substantially determined by the switches it uses and the number of phases it has (each phase requiring two switches). For example, portable computers and servers may commonly use six-phase converters.

Figure 32:
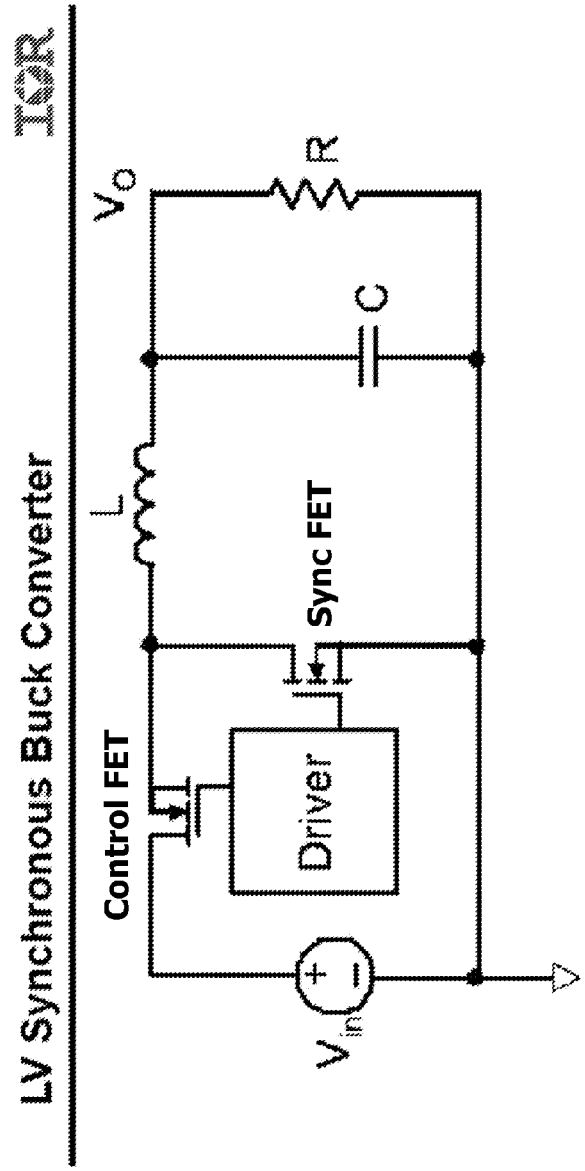
FIG. 32 is a schematic diagram of a typical buck converter.

FIG. 32 is a schematic diagram of a typical buck converter according to embodiments of the present invention, which would be one phase of such a six-phase DC-DC converter. It may consist of two devices: a control FET and a synchronization (sync) FET. The on-resistance of the sync FET may be an important factor in converter efficiency. The lower the target on-resistance, the bigger (in terms of gate periphery) this switch FET may be. In addition, both devices may switch as quickly as possible for best efficiency. This characteristic may be driven by the amount of charge under the gate and the mobility of those charges, since that determines how quickly those charges can be swept out from under the gate turning the switch off. Compound semiconductors have inherently lower on-resistance, lower gate charge, and higher mobility (~5x) compared with typical MOSFET switches. Embodiments according to the present invention may be manufactured at low cost, and it may have commercial advantages over, for example, MOSFET products. Thus, the present invention may provide a performance advantage at nearly equivalent costs.

Figure 33:
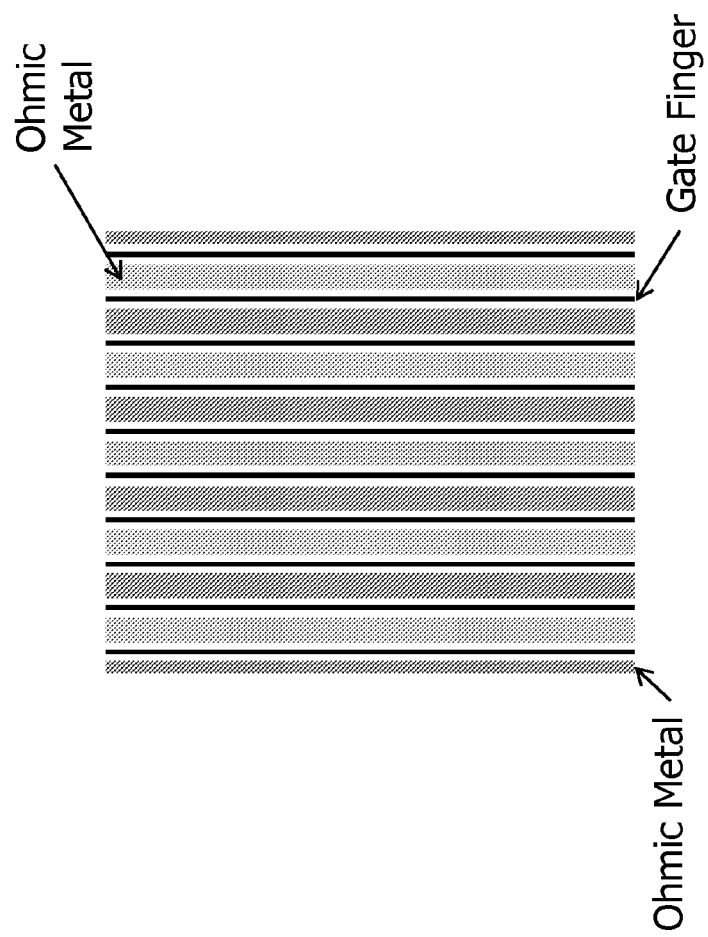
FIG. 33 illustrates the source, drain and gate metal pattern for a gFET™ device according to embodiments of the present invention.
Figure 34:
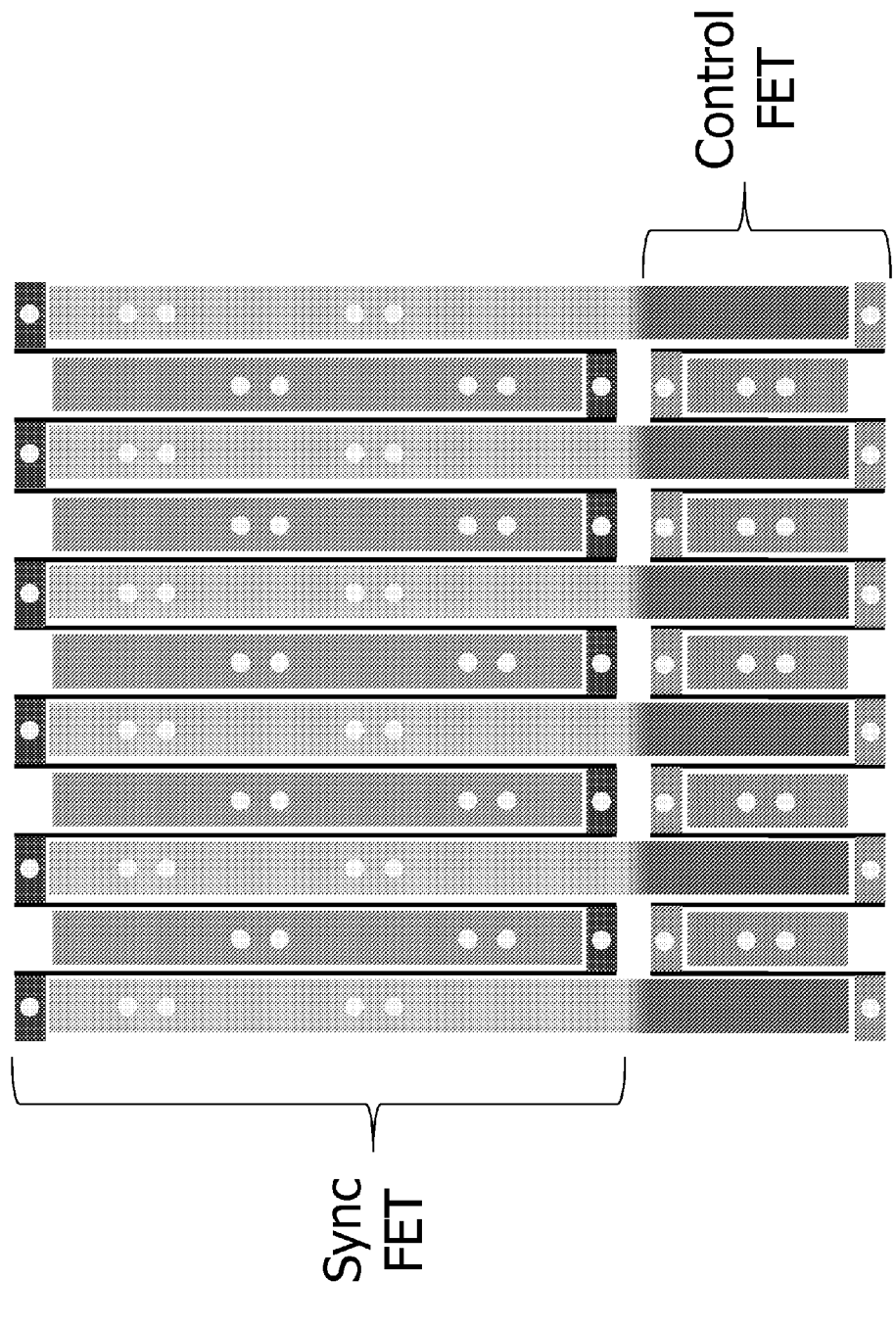
FIG. 34 shows a post pattern on the gFET™ device according to embodiments of the present invention.
Figure 35:
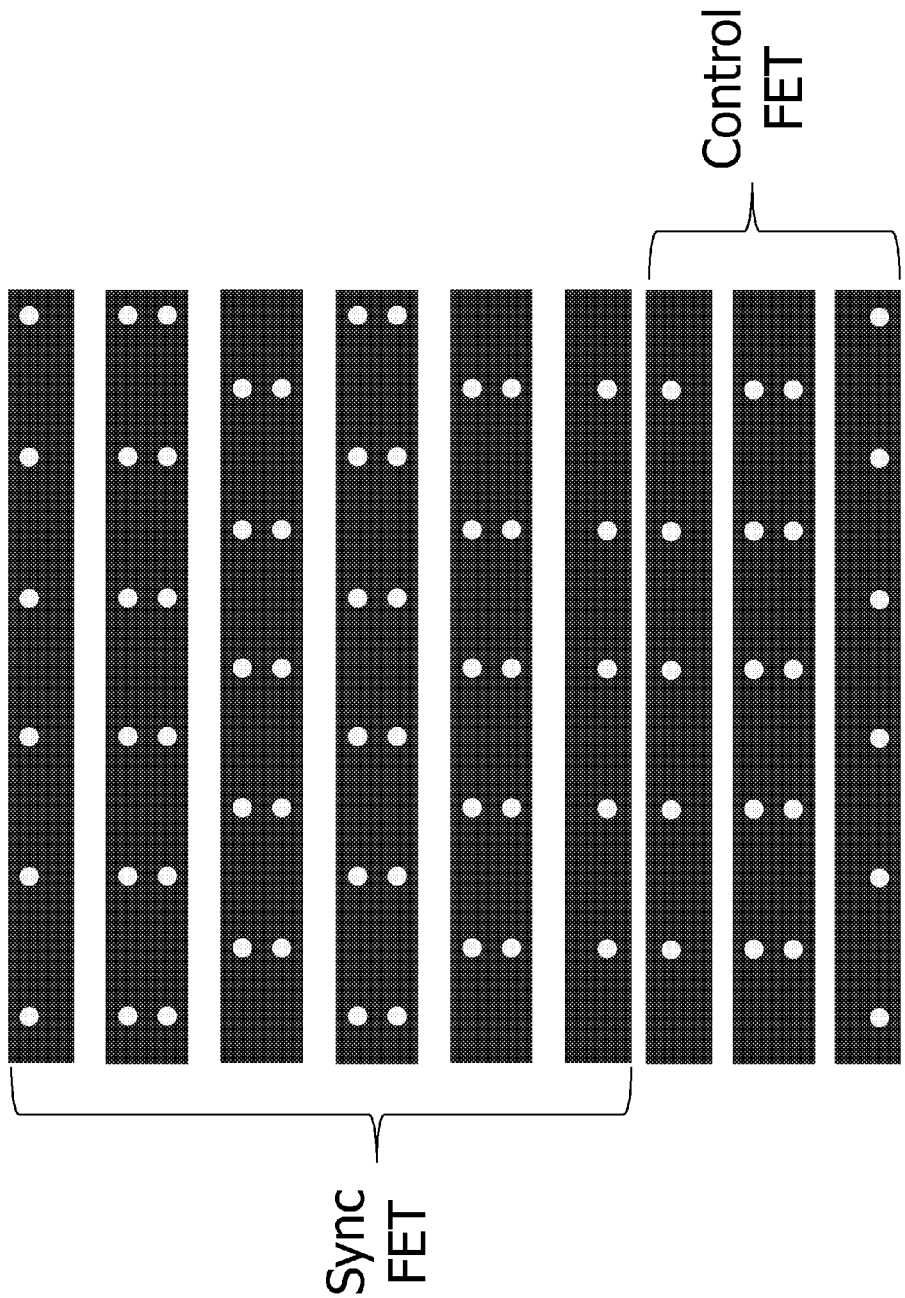
FIG. 35 depicts a post pattern on the interconnect substrate according to embodiments of the present invention.
Figure 36:
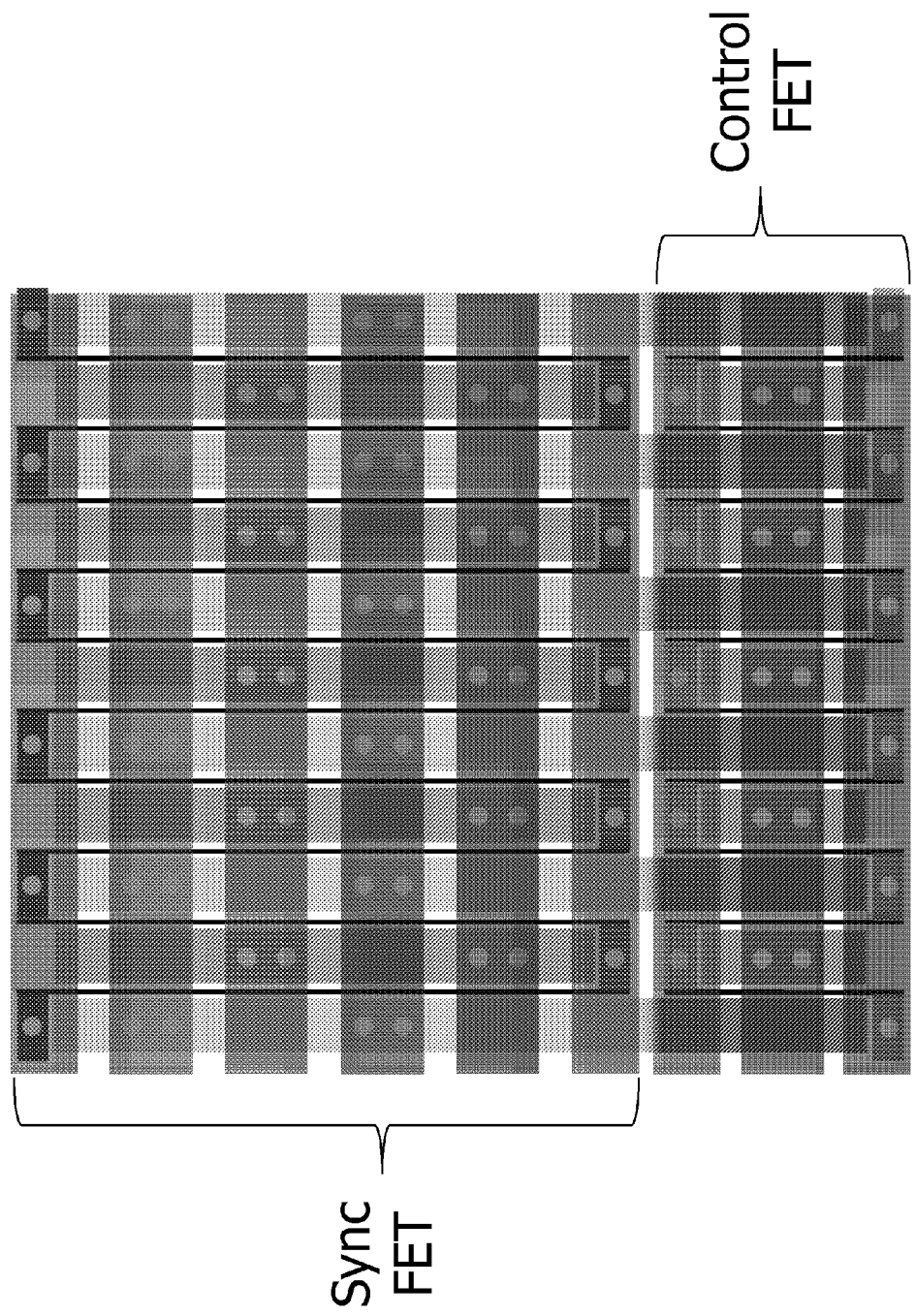
FIG. 36 illustrates the bonded structure of combined FIGS. 33 and 34 according to embodiments of the present invention.
Figure 37:
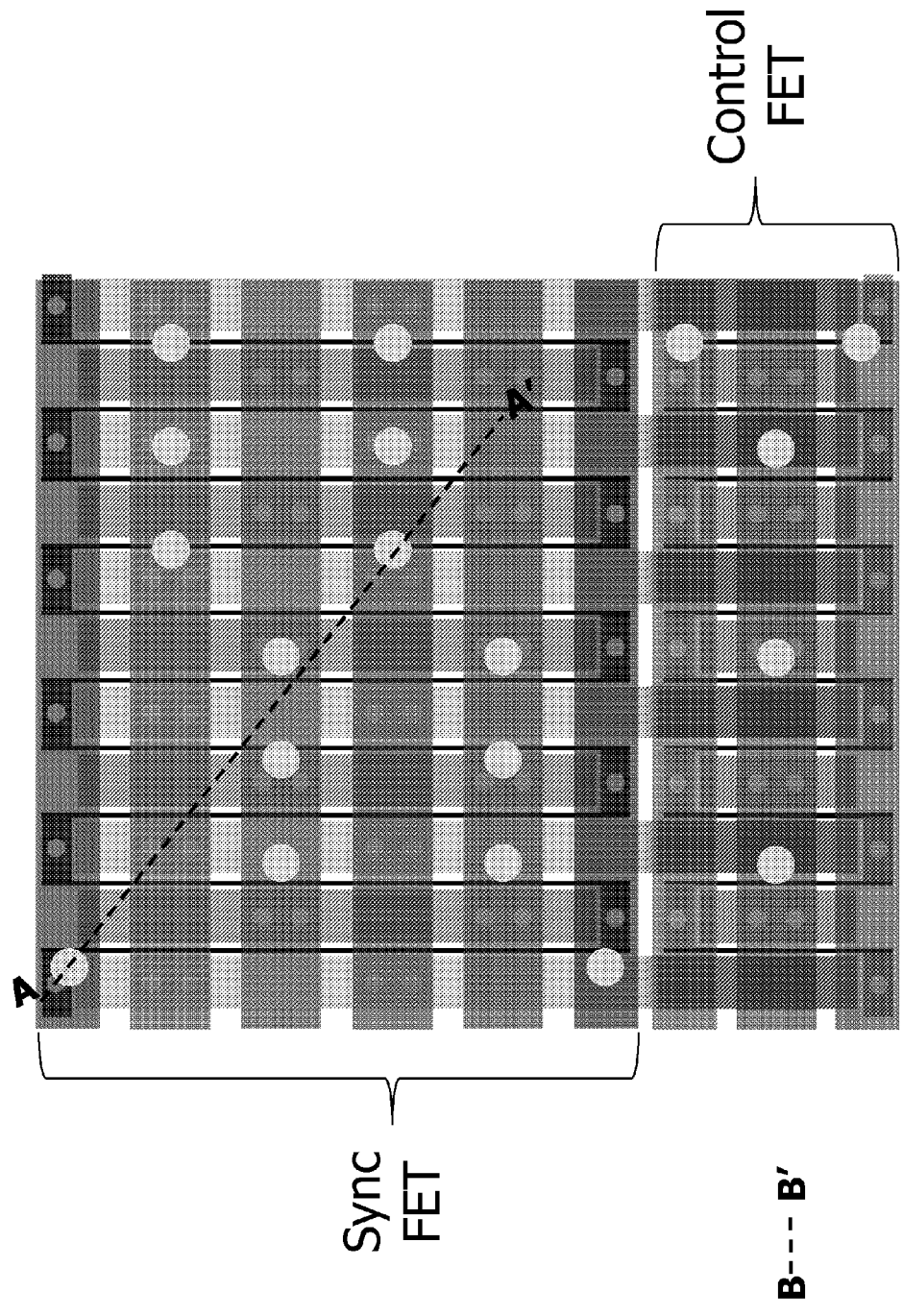
FIG. 37 is a cut-away view of copper vias between first and last metal layers according to embodiments of the present invention.
Figure 38:
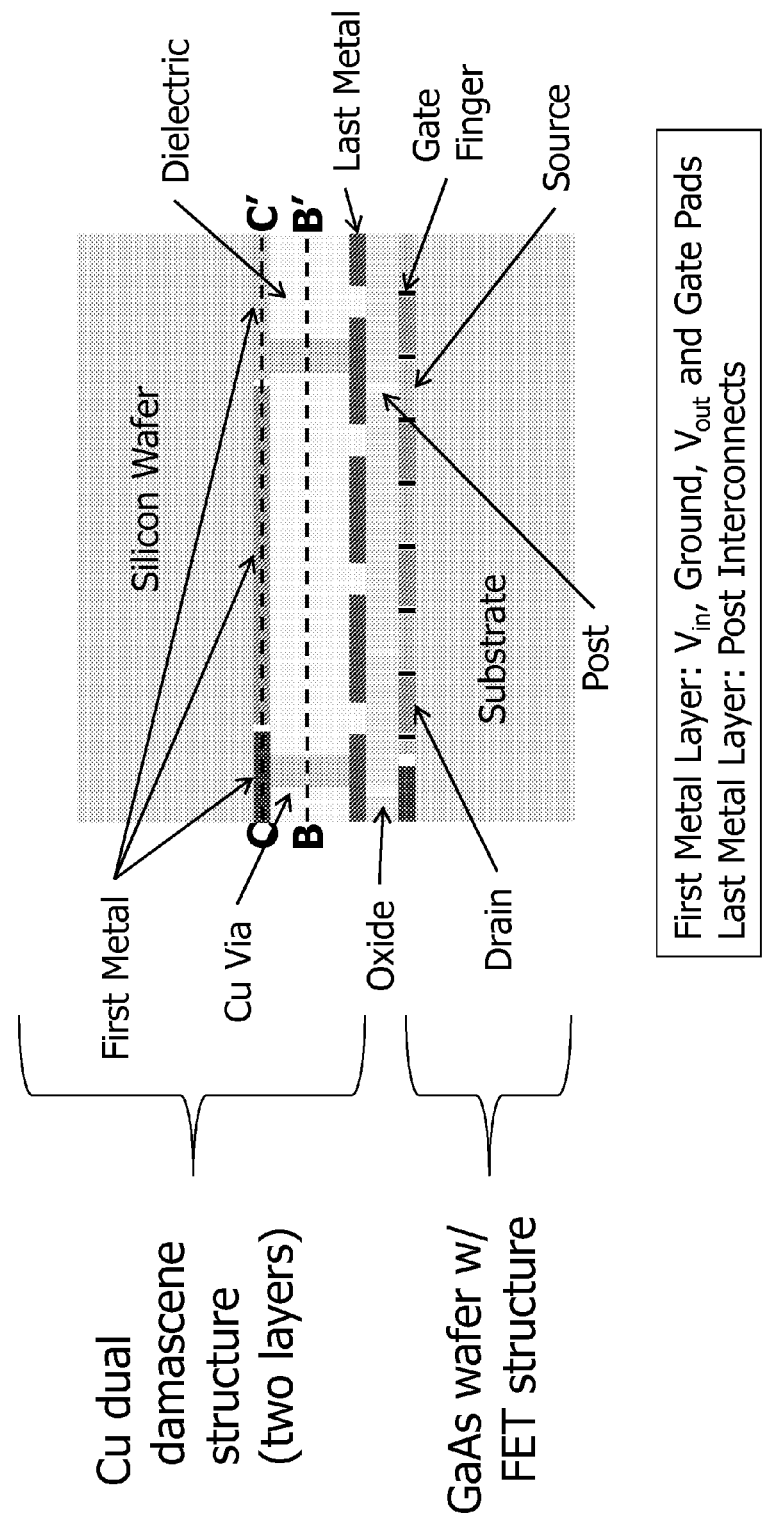
FIG. 38 shows a cross-sectional view of the bonded structure of FIG. 37.
Figure 39:
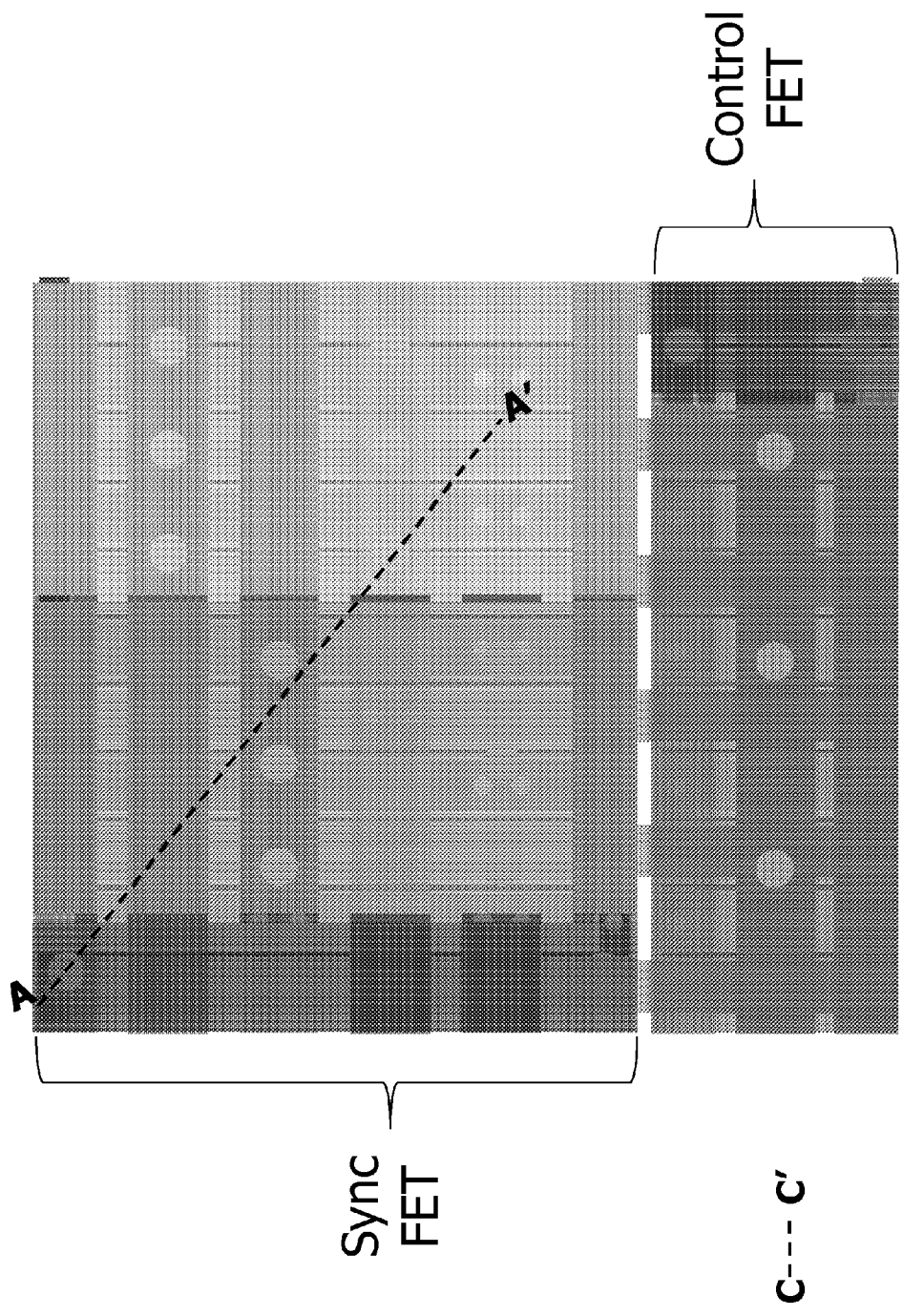
FIG. 39 is a cut-away view of the first metal layer of FIG. 38.
Figure 40:
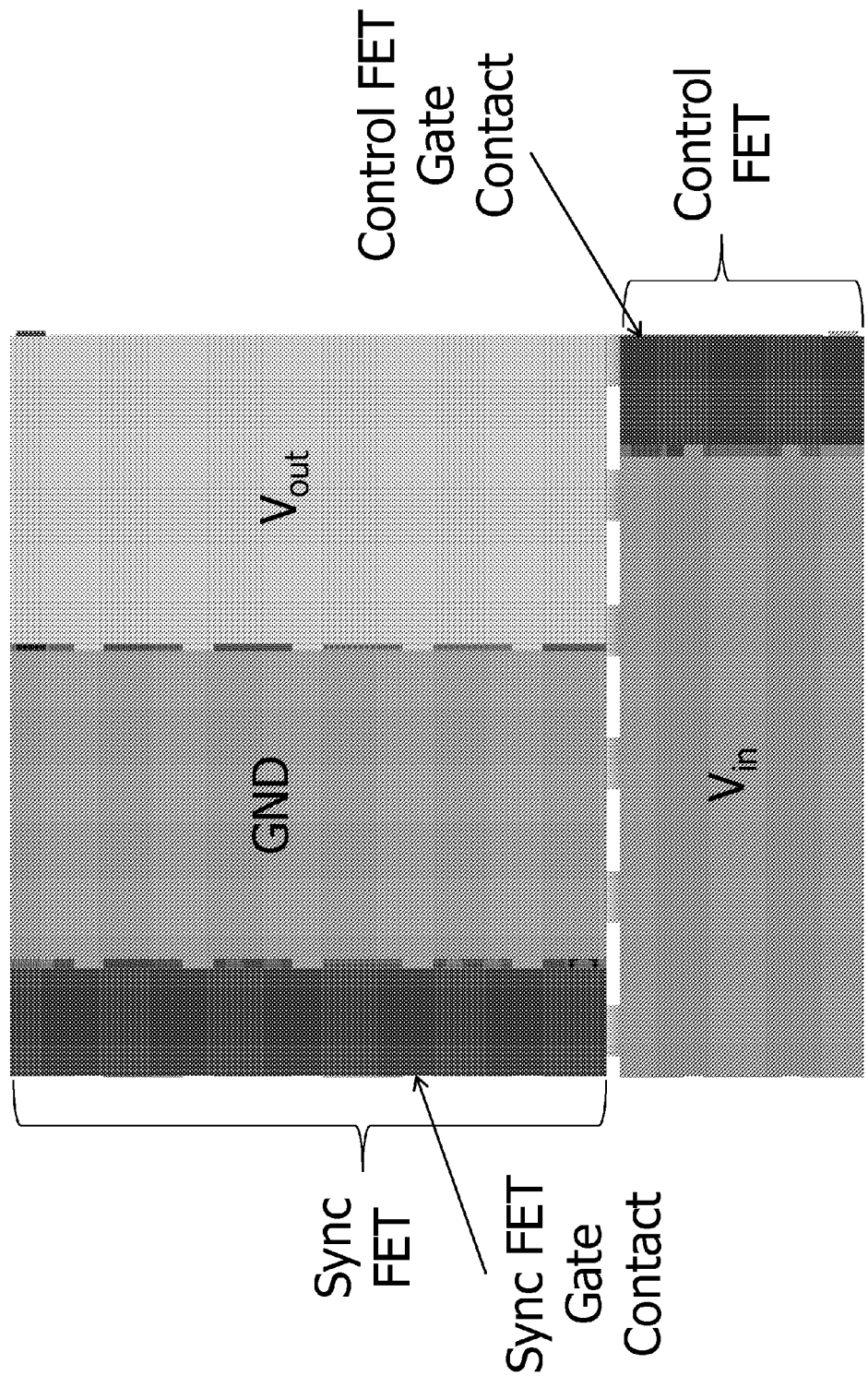
FIG. 40 illustrates a gFET™ device according to embodiments of the present invention.

FIG. 33 illustrates the compact source/drain/gate metallization pattern enabled by the Sarda design. FIG. 34 shows a post pattern on the gFET™ device fabricated with that pattern; FIG. 35 shows a post pattern on the interconnect substrate; and FIG. 36 illustrates the bonded structure of the combined FIGS. 33 and 34, all according to embodiments of the present invention. FIG. 37 is a cut-away view of copper vias between first and last metal layers according to embodiments of the present invention. FIG. 38 shows a cross-sectional view of the bonded structure of FIG. 37. FIG. 39 depicts a cut-away view of the first metal layer of FIG. 38. FIG. 40 illustrates a gFET™ device which may be surface mounted.

FIG. 41 shows a schematic diagram with the gFET™ device illustrated in FIG. 32 in a converter. All electrical terminals are on one surface facilitating easy bumping and flip die attach. The Vo terminal connects directly to the ohmic metal fingers that are common between the two devices.

Figure 42:
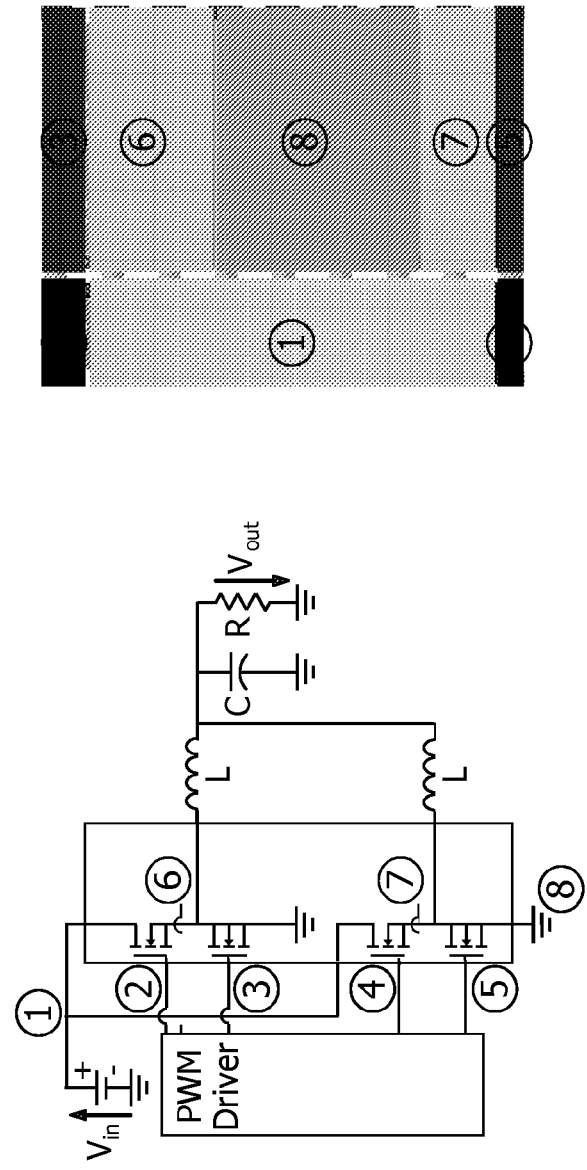
FIG. 42 is a schematic diagram of a dual gFET™ switch fabric according to embodiments of the present invention.

Through selection of different interconnect structures, a wide variety of different switch fabric designs can be made from this same basic structure. For example, FIG. 42 shows a dual gFET™ device switch fabric (quad switch device) configured as two separate control/sync pairs with a common input and separate outputs. In this example, the top pair might consist of larger devices (e.g., having lower resistance, higher current handling capability, etc.) and the lower pair could be much smaller devices (e.g., having higher resistance, lower current handling capability, etc.). This latter pair would be suitable for a "baby phase" used when the load is only requiring a small amount of current (such as in standby mode). In embodiments of the present invention, the top pair may be turned off and the overall efficiency of the converter maximized. If the load required high current, on the other hand, both pairs may be on operating in parallel to deliver the maximum amount of energy at an optimal efficiency point. Further embodiments of the present invention may include pairs with identical ratios to support two identical, but separate, phases on the same die (to save space, for example). As would be appreciated by one of ordinary skill in the art, other applications are possible.

Figure 43:
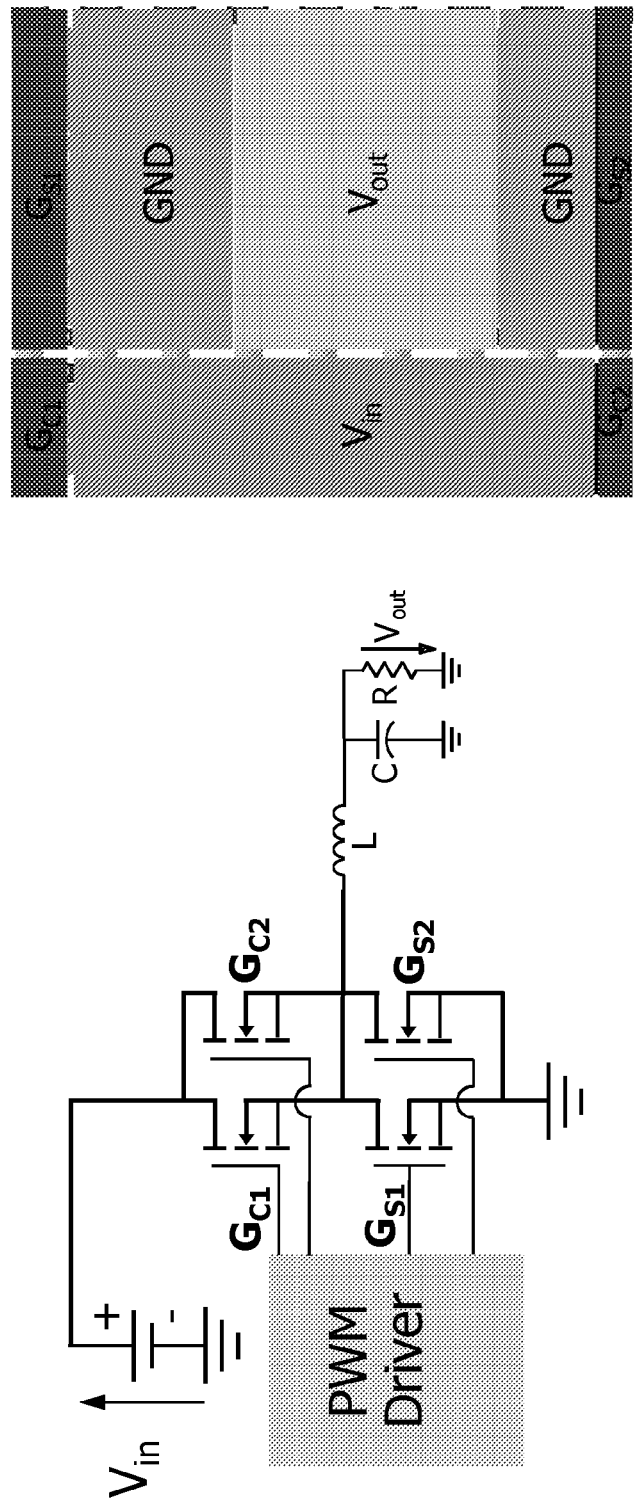
FIG. 43 is a schematic diagram of a variable resistance ratio gFET™ switch fabric according to embodiments of the present invention.

Different interconnect structures may yield different configurations, for example, a variable resistance ratio FET switch fabric as shown in FIG. 43. The control and sync FETs are segmented, but the entire device is a single control/sync pair with one input and one output. Since each of the segments is separately controlled, the resistance ratio between the control and sync FETs can be dynamically adjusted by turning on one or the other or both segments independently in the two FETs. Through choice of resistor values (relative segment sizes) nine different resistance ratios may be possible.

Figure 44:
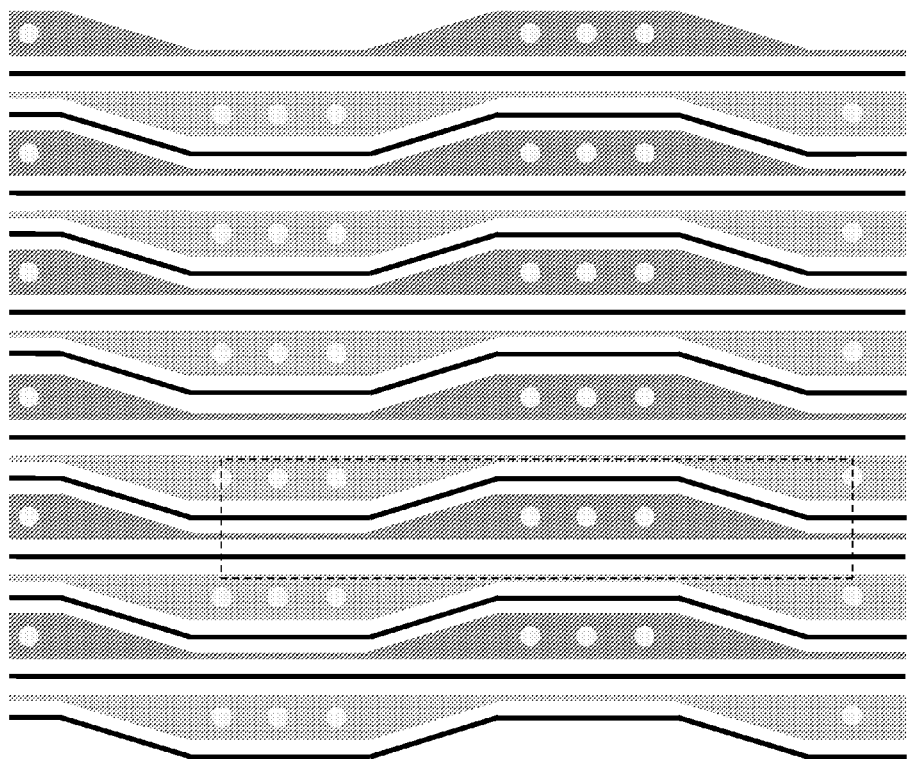
FIG. 44 illustrates a layout for the source, drain and gate metal pattern for a gFET™ device according to various embodiments of the present invention.
Figure 45:
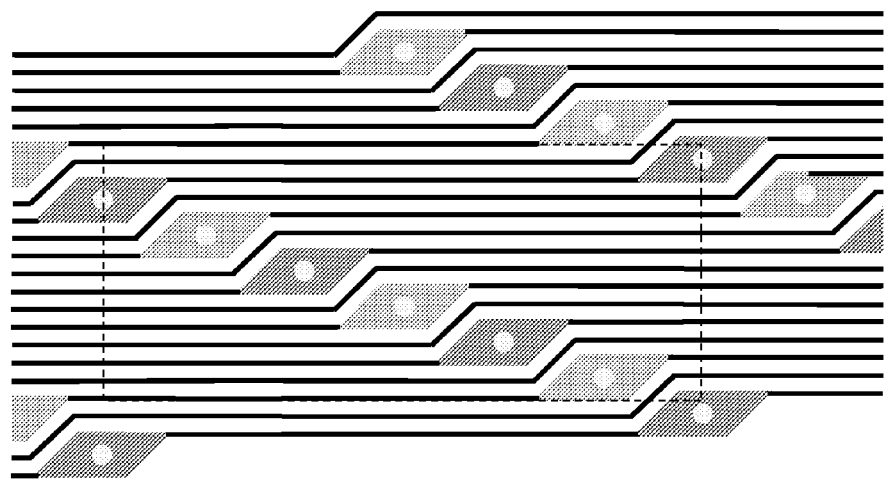
FIG. 45 illustrates a layout for the source, drain and gate metal pattern for a gFET™ device according to further embodiments of the present invention.
Figure 47:
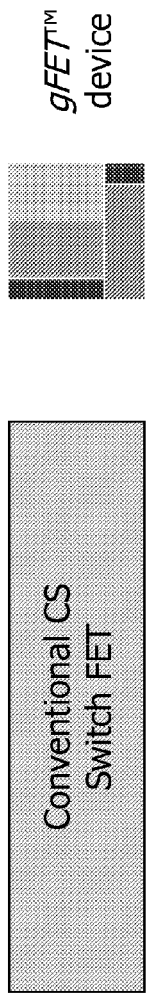
FIG. 47 is a comparison between a compound semiconductor switch and a gFET™ switch according to embodiments of the present invention.

FIG. 44 illustrates a layout for a gFET™ device according to further embodiments of the present invention. And FIG. 45 illustrates a layout for a gFET™ device according to various embodiments of the present invention.

FIG. 46 is a table comparing a typical FET with a typical power FET geometry and three embodiments of the gFET™ device geometry according to the present invention.

With reference to FIG. 37, a break anywhere in the gate renders a typical device useless. In embodiments according to the present invention, a break may not be fatal because there are feeds from both ends of each gate finger, so the voltage that gets to the break from both directions still can pinch off the channel (turn-off the switch) assuming the break is reasonably small, as may typically be the case. Embodiments of the present invention include a better yield. Coupled with the inherently smaller size of embodiments of the present invention there may be twelve times more good die per wafer using the present invention process and configuration.

48 provides a table comparing a typical MOSFET switch FET and a gFET™ device according to embodiments of the present invention. The on-resistance of typical MOSFET switches for this type of application may be 1.25 milli-Ohms, comparable to the gFET™ device shown in the table. However, the typical MOSFET requires significantly more carriers to achieve such a low on-resistance. This necessarily means more carriers (charge) under the gate ($Q_g$) and a much higher (worse) FOM (5x) than the gFET™ device. However, the projected size of the gFET™ device may be essentially identical to the packaged MOSFET switch.

FIG. 48 is a typical Gallium Nitride (GaN) switch device and a projected gFET™ device according to embodiments of the present invention. The IR device that has been released (Gen1.1) has a FOM of 30. It is not projected to reach a FOM of 5, a value comparable to what embodiments of the present invention may be expected to achieve, until 2013.

Figure 50:
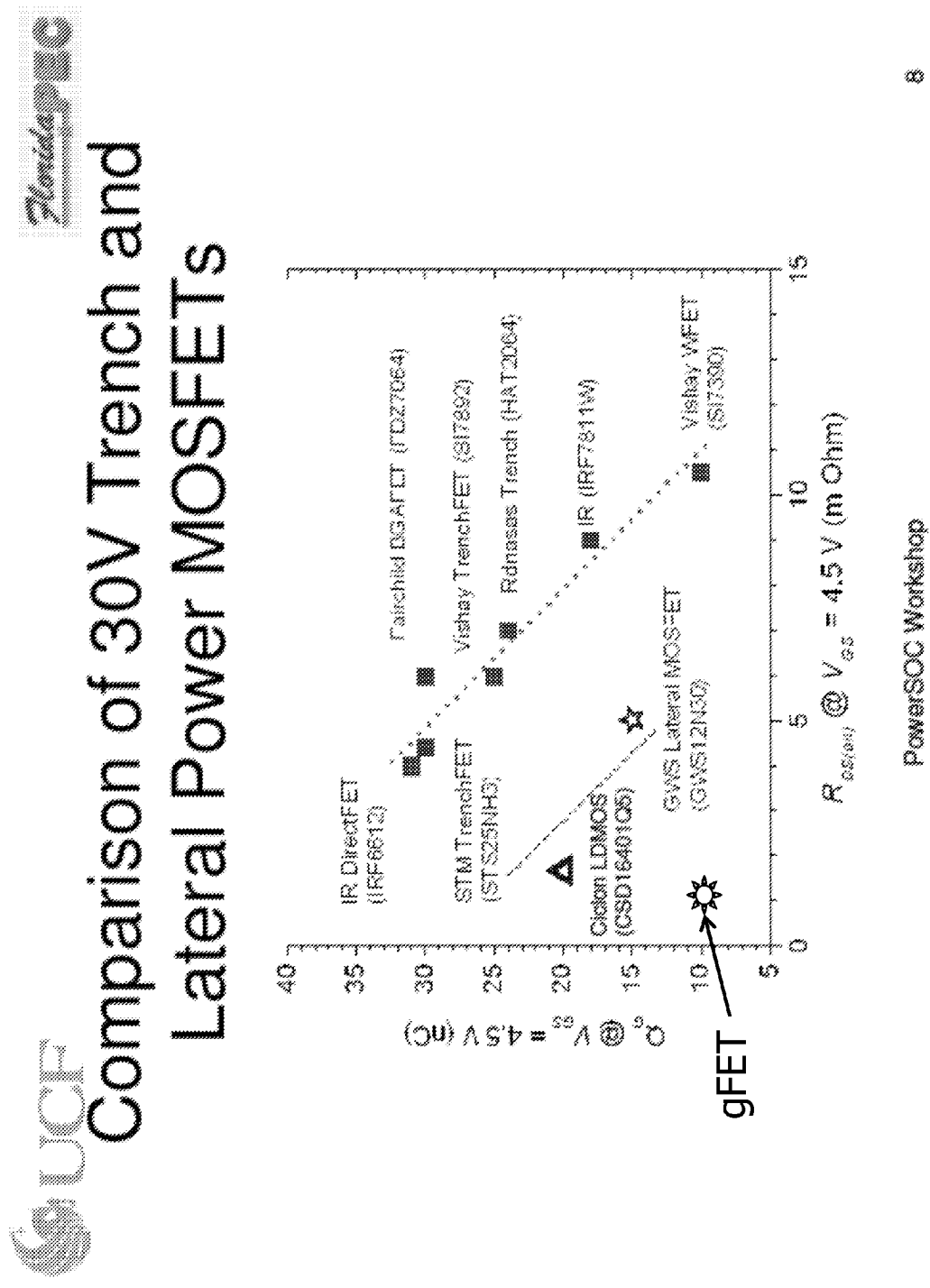
FIG. 50 is a graph illustrating a comparison between 30V Trench and Lateral Power MOSFETs devices, and a gFET™ device according to embodiments of the present invention.
Figure 51:
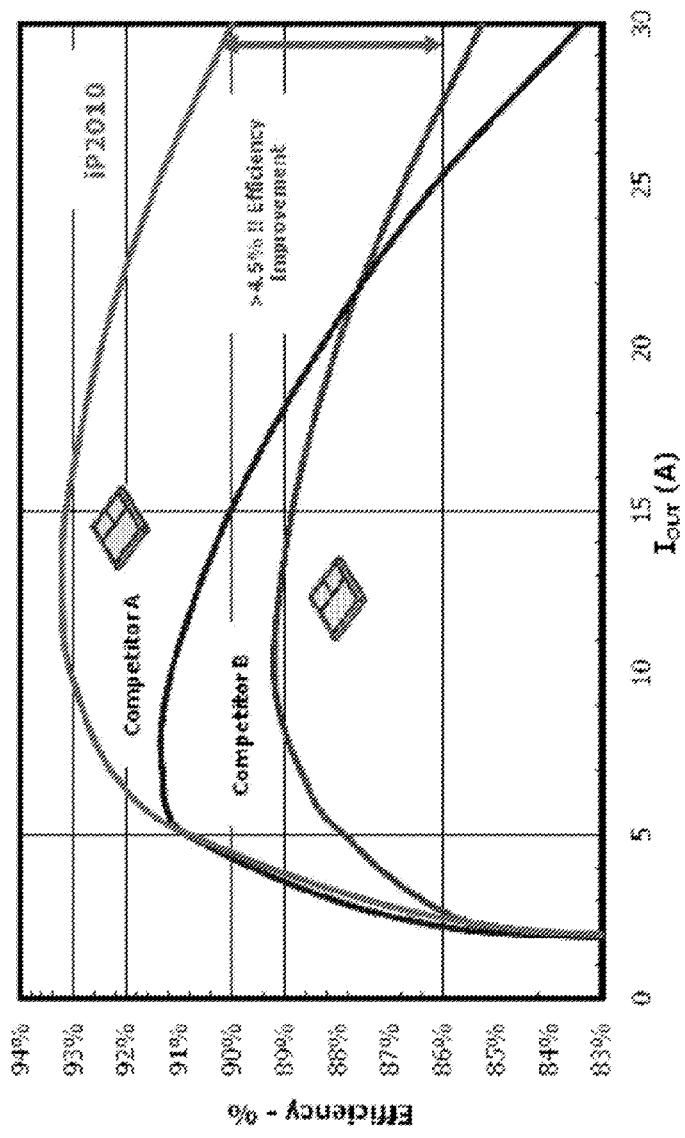
FIG. 51 is a graph illustrating a comparison of the measured efficiency of a Buck Converter using the GaNpowIR Gen 1.1 compound semiconductor switch device shown in FIG. 49 compared to typical MOSFET-based Buck Converters.

FIG. 50 is a graph illustrating a comparison between 30V Trench and Lateral Power MOSFETs, and a gFET™ device of according to embodiments of the present invention. The right hand line may be roughly a FOM of 140-150. Certain advanced MOSFET devices are on a line with about a FOM of 50-60. The present invention at the time of this application may be expected to achieve a FOM of 5.

Figure 49:
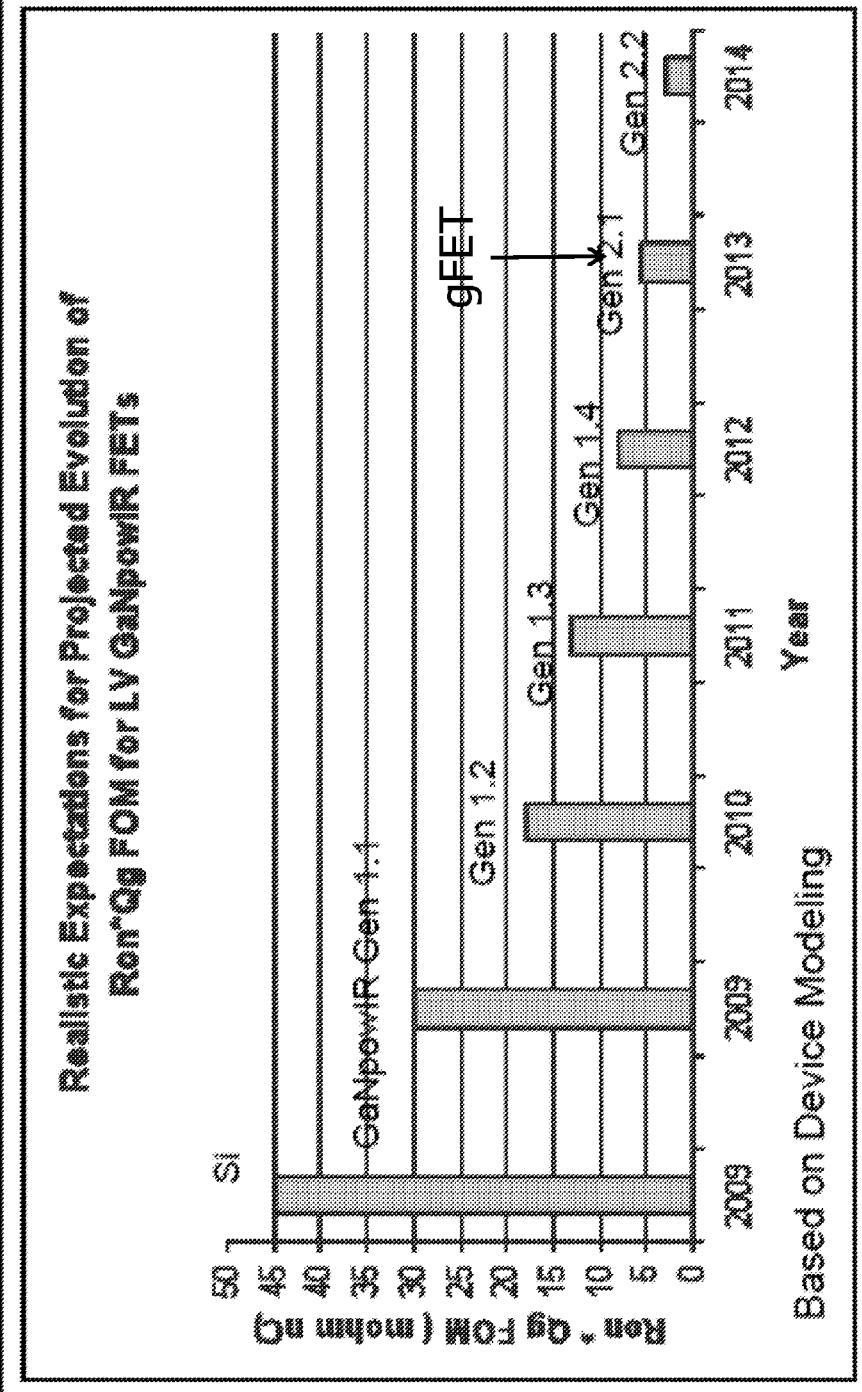
FIG. 49 is a graph depicting performance characteristics of a typical Gallium Nitride (GaN) switch devices and a projected gFET™ device according to embodiments of the present invention.

FIG. 48 is a graph illustrating the measured efficiency of a Buck Converter using an GaNpowIR Gen 1.1 compound semiconductor switch device shown in FIG. 49 compared to Buck Converters using typical MOSFET devices. The converter efficiency improvement may be 4 percentage points. Considering a converter may be 89% efficient, its loss may be about 11%. If the loss is reduced to 7% (a 4 percentage point improvement), then that corresponds to nearly a 40% reduction in loss. Since the FOM of embodiments of the present invention may be significantly better than that of the GaNpowIR Gen 1.1 device, it may be reasonable to assume that the efficiency improvement of a DC-DC converter using the present invention would be at least as good as that of one using the IR device shown in the Figure.

The average server computer uses about 150 watts. The energy required for cooling and power distribution may be about 2.5× that of the energy consumed by the server itself. So each server requires about 525 watts to operate and cool it. Assuming that electricity costs about 8 cents per kilowatt-hour, the electricity to run each server costs about $1 per day. If the converter efficiency improves by 4%, then the electricity savings per server may be 4 cents per day. Assuming that a gFET™ switch can be sold for a price comparable to a present art MOSFET switch (about $2) then a six-phase DC-DC converter will have $12 worth of gFET™ switches in it. At 4 cents per day electricity savings, those switches pay for themselves in less than one year. That savings doesn't take into account the fact that because the gFET™ switches can operate at higher frequency, the size, and thus the cost, of the converter will be less because the other components in it (inductors, capacitors, etc.) are smaller (and cheaper) for higher frequency operation.

Figure 52:
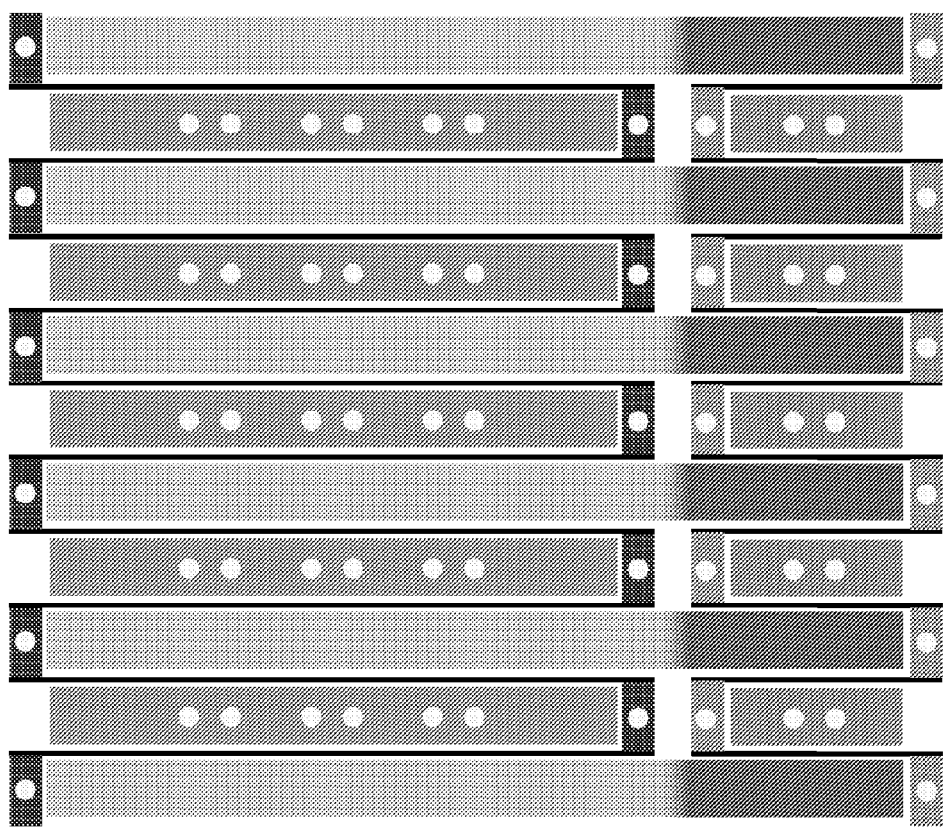
FIG. 52 illustrates a post pattern on a Cascode FET according to embodiments of the present invention.
Figure 53:
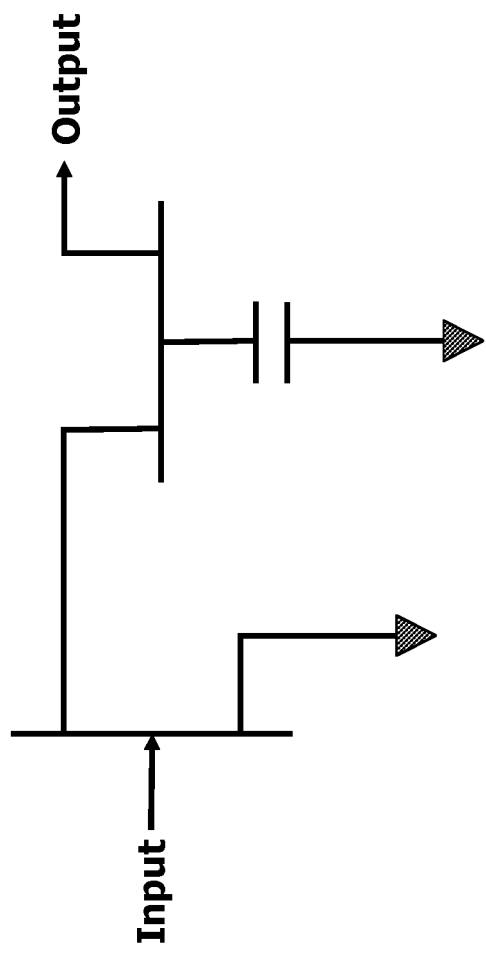
FIG. 53 is a schematic diagram of a Cascode device according to embodiments of the present invention.

FIG. 52 illustrates a post pattern on Cascode FET according to embodiments of the present invention.

FIG. 52 provides a schematic diagram of a cascode device according to embodiments of the present invention. For a Cascode FET the drain of the smaller (input) device may have a direct connection to the source of the larger (output) device. The gate of the output device may be connected to ground with a capacitor, which may effectively ground the gate at high frequency. Such a cascode configuration creates a two-stage amplifier with high gain but also high output-to-input isolation, which helps prevent the amplifier from oscillating.

Figure 54:
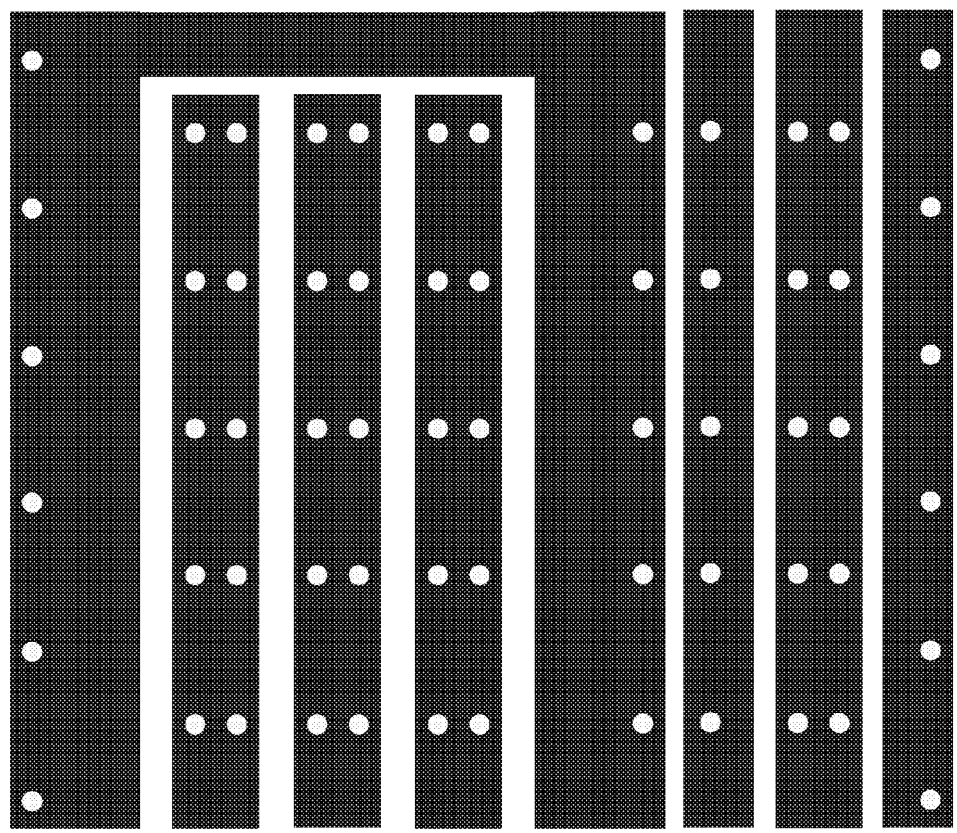
FIG. 54 illustrates a post pattern on interconnect substrate for the embodiment of FIG. 52.

FIG. 54 illustrates a post pattern on interconnect substrate for the embodiment of FIG. 52.

Figure 55:
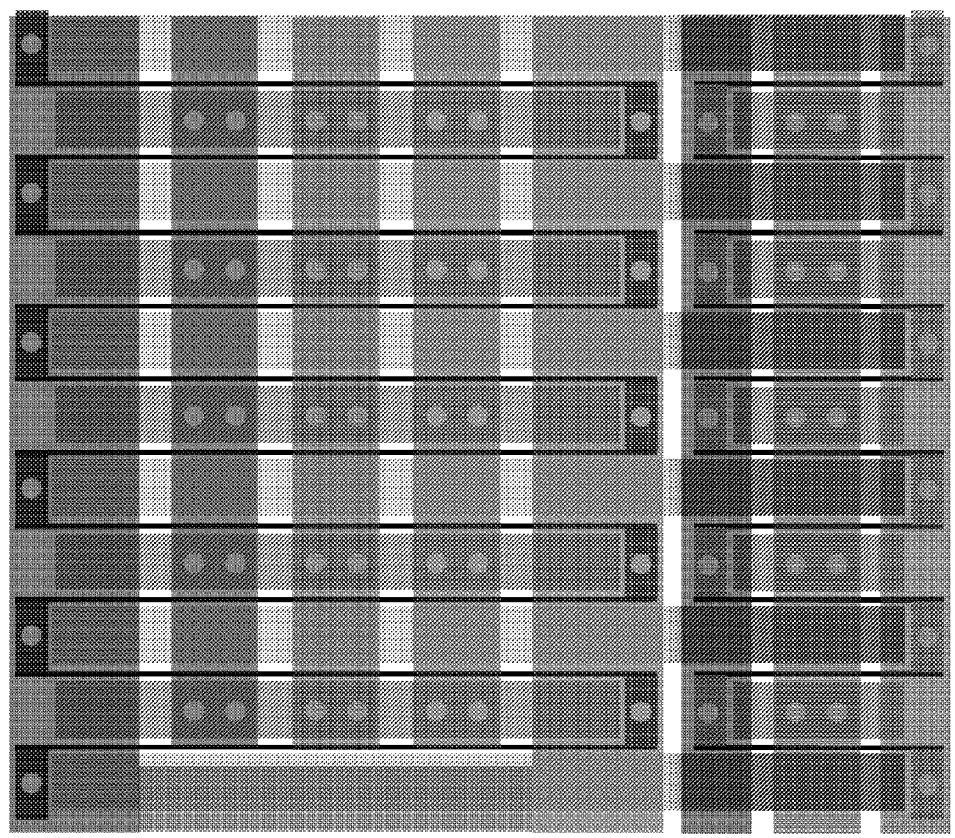
FIG. 55 illustrates a bonded structure.

FIG. 55 illustrates a bonded structure.

Figure 56:
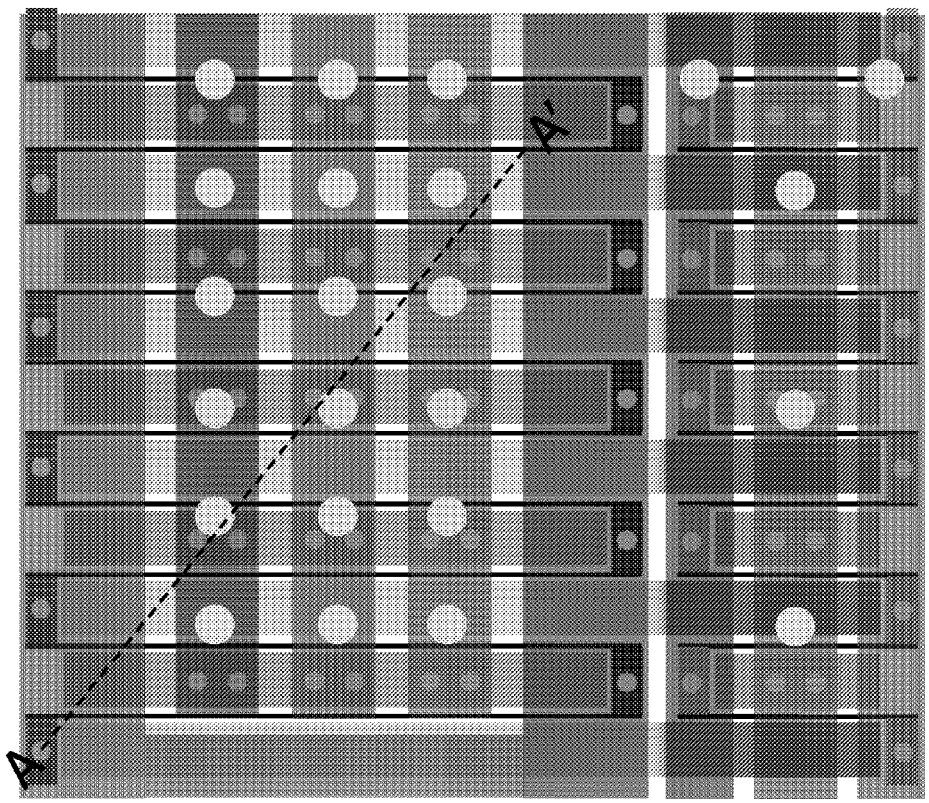
FIG. 56 is a cut-away view of copper vias between first and last metal layers of FIG. 55.

FIG. 56 may be a cut-away view of copper vias between first and last metal layers for FIG. 55.

Figure 57:
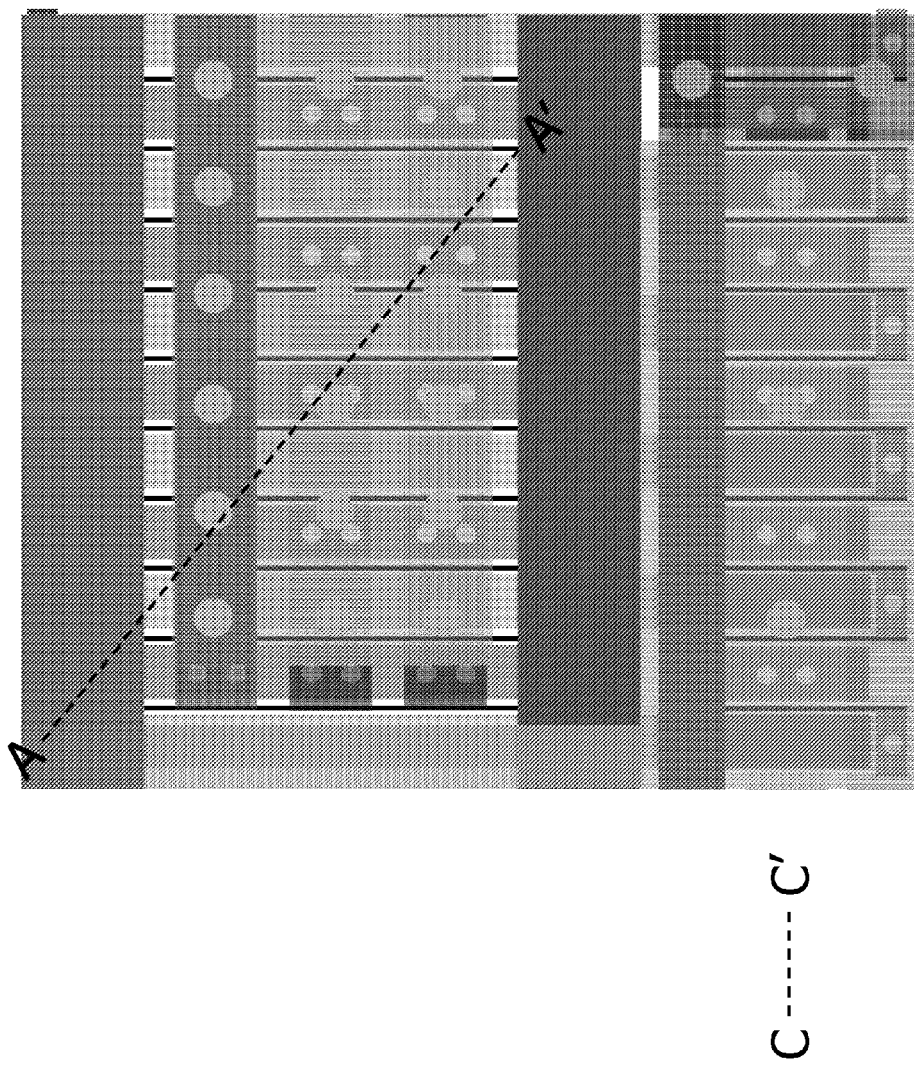
FIG. 57 shows a cutaway view of a first metal layer according to embodiments of the present invention.

FIG. 57 shows a cutaway view of the first metal layer of the embodiment of the present invention according to embodiments of the present invention.

Figure 58:
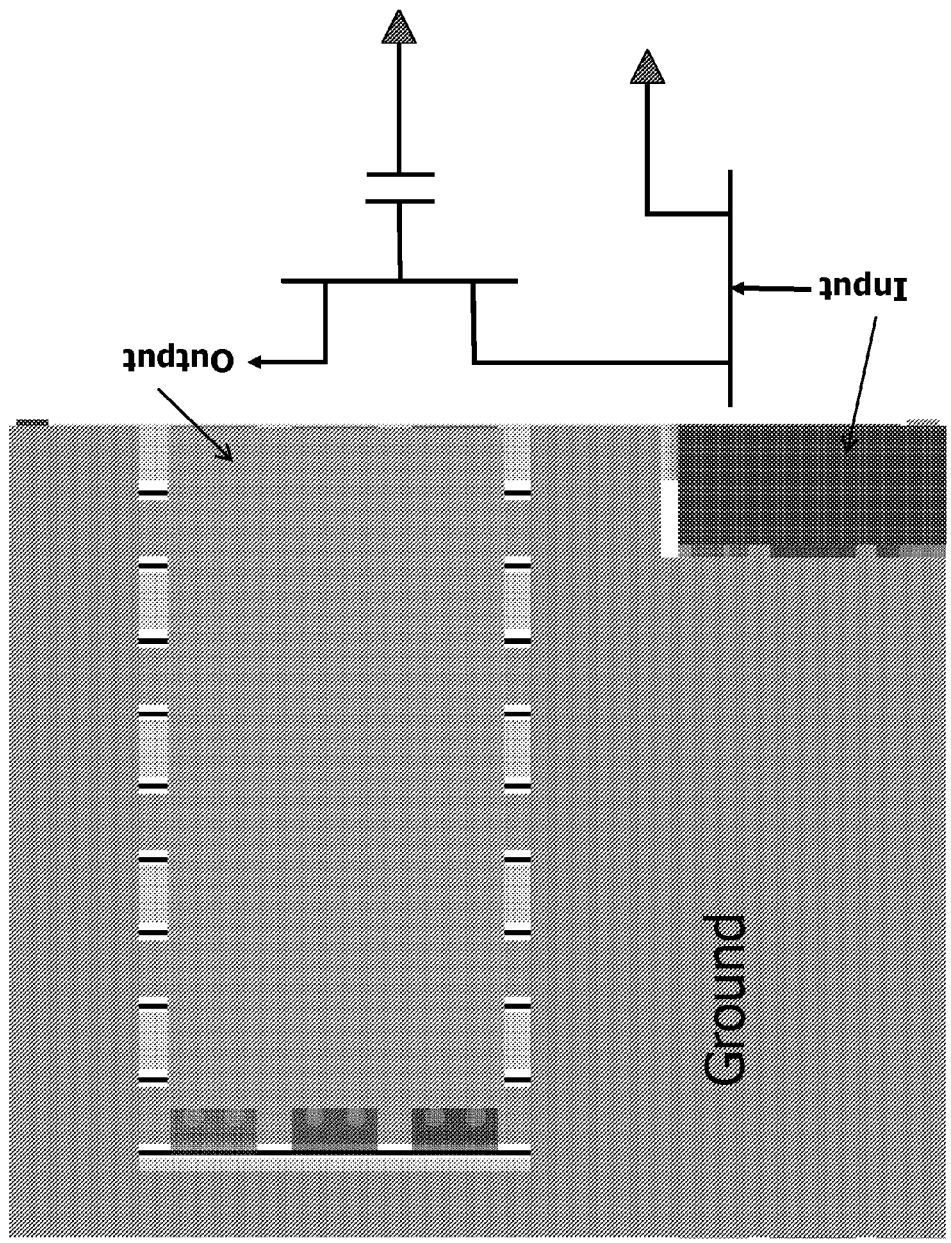
FIG. 58 illustrates a Cascode FET according to embodiments of the present invention.

FIG. 58 illustrates a Cascode FET which may be surface mounted according to embodiments of the present invention. Embodiments of the present invention may incorporate a direct connection between the input device drain and the output device source that may be virtually lossless, because it is integrated directly into the device, which may be a great advantage with the present invention. Also, the large C-shaped section of the ground pad (first level metal) may be separated from the underlying output device gate last level metal by silicon dioxide creating the output gate bypass capacitor, thus also integrated directly into the device.

Certain modifications and improvements will occur to those skilled in the art upon a reading of the foregoing description. Applications of the devices and methods according to the present invention include Power FETs, MMICs, gFET™ devices, push-pull amplifier, and the like, and applications thereof, by way of example but not limitation, servers, personal computers, electric cars, media players, mobile communications devices, portable computing devices, etc. In the example of MMICs, the wire bonds of a typical device may be omitted and instead posts may be used as set forth in the foregoing description, and the die size may be advantageously reduced by more than about 40%. In the example of push-pull amplifiers, which include an input 0-180 degrees power splitter driving two identical devices in anti-phase and a 0-180 degrees output power combiner adding the output power of the two devices in the amplifier load, advantages of the methods and devices according to the present invention provide push-pull power FET for a push-pull amplifier with four (4) times higher device impedance compared to a single-ended device with the same output power, a virtual ground that can be used for more compact and simpler matching structures, and cancellation of even products and harmonics for better efficiency and linearity; these are illustrated in FIG. 24 for a push-pull amplifier schematic and virtual ground and FIG. 25 for a balanced amplifier schematic.

The above-mentioned examples are provided to serve the purpose of clarifying the aspects of the invention and it will be apparent to one skilled in the art that they do not serve to limit the scope of the invention. The foregoing described illustrative embodiments of the present invention are examples of specific implementations in accordance with the inventive principles. It is to be understood that numerous and varied other modifications will occur to those skilled in the art in accordance with these inventive principles. In such cases, the invention is only restricted by the following claims wherein it is defined.

The invention claimed is:

1. A system comprising:
a power supply;
a control switch formed on a substrate, the control switch including:
a first terminal coupled to a first terminal of the supply and to a control drain finger,
a second terminal coupled to a control source finger, the control source finger coupled to a load, and
a third terminal coupled through a control gate pad to a control gate finger disposed between the control drain finger and the control source finger;
a sync switch formed on the substrate, the sync switch including:
a fourth terminal coupled to the second terminal of the supply and to a sync source finger,
a sync drain finger contiguous with the control source finger to form a single continuous ohmic finger,
a fifth terminal coupled through a sync gate pad to a sync gate finger disposed between the sync drain finger and the sync source finger, the control gate pad and the sync gate pad disposed between the control drain finger and the sync source finger; and
a driver coupled to the third terminal of the control switch to provide a control gate signal to the control gate finger for switching current between the control drain and the control source, the driver coupled to the fifth terminal of the sync switch to provide a sync gate signal to the sync gate finger for switching current between the sync drain finger and the sync source finger.

2. The system of claim 1, further comprising:
a plurality of control drain fingers coupled to the first terminal;
a plurality of control source fingers coupled to the second terminal, the control source fingers alternating with the control drain fingers;
a plurality of sync source fingers coupled to the fourth terminal, the sync source fingers alternating with a plurality of sync drain fingers, the control source fingers contiguous with the sync drain fingers fingers;
a plurality of control gate fingers connected through a serpentine path to the third terminal; and
a plurality of sync gate fingers connected through serpentine path to the fifth terminal.

3. The system of claim 1, wherein the substrate is Gallium Arsenide or Gallium Nitride.

4. A dual Field Effect Transistor device comprising:
a compound semiconductor layer;

a plurality of common ohmic metal fingers disposed on a semiconductor material, each common ohmic metal finger including both source and drain regions along a continuous ohmic metal finger;

a plurality of sync ohmic metal fingers disposed along a first portion of a width of the common ohmic metal fingers and alternating with the common ohmic metal fingers;

a plurality of control ohmic metal fingers disposed along a second portion of the width of the common ohmic metal fingers and alternating with the common ohmic metal fingers, the sync ohmic metal fingers aligned with the control ohmic metal fingers;

a plurality of sync gate fingers disposed between the sync ohmic metal fingers and the first portion of the common ohmic metal fingers;

an inner set of sync gate pads configured to connect adjacent sync ohmic metal fingers, the inner set of sync gate pads disposed between the sync ohmic metal fingers and the control ohmic metal fingers;

a plurality of control gate fingers disposed between the control ohmic metal fingers and the second portion of the common ohmic metal fingers; and an inner set of control gate pads configured to connect adjacent control ohmic metal fingers, the inner set of control gate pads disposed between the sync ohmic metal fingers and the control ohmic metal fingers.

5. The device of claim 4, wherein the plurality of sync ohmic metal fingers are source fingers.

6. The device of claim 4, wherein the plurality of control ohmic metal fingers are drain fingers.

7. The device of claim 4, wherein the first portion of the width of the common ohmic metal fingers forms source fingers and the second portion of the width of the common ohmic metal fingers forms drain fingers.

8. The device of claim 4, further comprising an outer set of sync gate pads configured to connect adjacent sync gate fingers and disposed opposite the sync gate fingers from the inner set of sync gate pads.

9. The device of claim 4, further comprising an outer set of control gate pads configured to connect adjacent control gate fingers and disposed opposite the control gate fingers from the inner set of control gate pads.

10. A method for switching current using a Field Effect Transistor, the method comprising:

partitioning source current into a plurality of source current segments for distribution to a plurality of source vias disposed along a width of a source element of the Field Effect Transistor between a source via proximate each end of the source element;

distributing the plurality of source current segments to sections of the source element through a plurality of source electrodes, each of the source electrodes in electrical contact to at least one of the sections through at least one of the plurality of source vias;

partitioning drain current into a plurality of drain current segments for distribution to a plurality of drain vias along a width of a drain element of the Field Effect Transistor between a via proximate each end of the drain element, the drain element disposed adjacent the source element;

distributing the plurality of drain current segments to sections of the drain element through a plurality of drain electrodes, each of the drain electrodes in electrical contact to at least one of the sections through at least one of the plurality of drain vias;

coupling a gate signal to a gate finger disposed between the adjacent source and drain element, the gate signal coupled to the gate finger through a first end of the gate finger and through a second end of the gate finger; and switching current between the source element and the drain element using the gate signal coupled through both ends of the gate finger.

11. The method of claim 10, wherein the plurality of source electrodes are disposed adjacent to and alternating with the plurality of drain electrodes, and the plurality of source and drain electrode cross the source and drain elements at about ninety degrees.

12. The method of claim 10, further comprising partitioning source current in each of the source electrodes into a plurality of source current segments disposed along a length of each source electrode.

13. The method of claim 12, further comprising distributing the plurality of source current segments disposed along the length of each source electrode through source vias to sections of a plurality of source elements disposed along the length of each source electrode.

14. The method of claim 13, further comprising partitioning drain current in each of the drain electrodes into a plurality of drain current segments disposed along a length of each drain electrode.

15. The method of claim 14, further comprising distributing the plurality of drain current segments disposed along the length of each drain electrode through drain vias to sections of a plurality of drain elements disposed along the length of each drain electrode and alternating with the source elements.

16. The method of claim 15, wherein a plurality gate fingers are disposed between adjacent source fingers and drain fingers, and the gate signal is coupled through both ends of each of the plurality of gate fingers.

17. The method of claim 10, further comprising insulating the source electrodes from the drain element and insulating the drain electrodes from the source element.

18. The method of claim 10, further comprising applying the gate signal through vias connecting a first electrode to gate pads disposed along a first end of the gate fingers, and through vias connecting a second electrode to gate pads disposed along a second end of the gate fingers.

19. The method of claim 10, wherein the average length of the source element is less than about 20 microns.

20. The method of claim 10, wherein the Field Effect Transistor is fabricated using Gallium Arsenide or Gallium Nitride.

* * * * *